United States Patent
Lewis, II

(10) Patent No.: US 11,880,247 B2
(45) Date of Patent: *Jan. 23, 2024

(54) AIR DIRECTING DEVICE

(71) Applicant: CHATSWORTH PRODUCTS, INC., Agoura Hills, CA (US)

(72) Inventor: Richard Evans Lewis, II, Austin, TX (US)

(73) Assignee: Chatsworth Products, Inc., Simi Valley, CA (US)

( * ) Notice: Subject to any disclaimer, the term of this patent is extended or adjusted under 35 U.S.C. 154(b) by 73 days.

This patent is subject to a terminal disclaimer.

(21) Appl. No.: 17/486,778

(22) Filed: Sep. 27, 2021

(65) Prior Publication Data

US 2022/0035426 A1    Feb. 3, 2022

Related U.S. Application Data

(63) Continuation of application No. 16/182,276, filed on Nov. 6, 2018, now Pat. No. 11,132,035, which is a continuation of application No. 12/372,738, filed on Feb. 17, 2009, now Pat. No. 10,133,320.

(60) Provisional application No. 61/028,620, filed on Feb. 14, 2008.

(51) Int. Cl.
    *G06F 1/20*      (2006.01)
    *H05K 7/20*      (2006.01)

(52) U.S. Cl.
    CPC ........... *G06F 1/20* (2013.01); *H05K 7/20736* (2013.01)

(58) Field of Classification Search
    CPC ........ G06F 1/20; H05K 7/20736; H05K 7/20; H05K 7/20709; H05K 7/20754

USPC ................. 454/184, 284; 361/690, 691, 692
See application file for complete search history.

(56) References Cited

U.S. PATENT DOCUMENTS

| | | |
|---|---|---|
| 2,457,002 A | 12/1948 | Spiro |
| 3,192,306 A | 6/1965 | Skonnord |
| 3,362,403 A | 1/1968 | Fleming et al. |
| 3,364,838 A | 1/1968 | Bradley |
| 3,387,809 A | 6/1968 | Zwerling |

(Continued)

FOREIGN PATENT DOCUMENTS

| | | |
|---|---|---|
| AU | 2008254682 | 11/2012 |
| DE | 2537295 A1 | 4/1976 |

(Continued)

OTHER PUBLICATIONS

Information Disclosure Statement (IDS) Letter Regarding Common Patent Application(s), dated Apr. 6, 2022.

(Continued)

*Primary Examiner* — Avinash A Savani
*Assistant Examiner* — Ryan L Faulkner
(74) *Attorney, Agent, or Firm* — Tillman Wright, PLLC; James D. Wright; David R. Higgins

(57) ABSTRACT

An air directing device for thermal management in side breathing equipment includes at least three vertical panels disposed in generally parallel relationship and horizontally spaced a fixed distance from one another. Each panel defines a fin arranged orthogonally relative to an airflow path for deflection of cooling air into side breathing equipment. At least one of the panels is an inner panel that is wider than two outer panels. The air directing device further includes at least one connection member connecting the outer panels to one another.

20 Claims, 23 Drawing Sheets

(56) References Cited

U.S. PATENT DOCUMENTS

| | | |
|---|---|---|
| 3,404,931 A | 10/1968 | Fall et al. |
| 3,407,016 A | 10/1968 | Kronenberger |
| 3,482,861 A | 12/1969 | Keating |
| 3,493,237 A | 2/1970 | Kleindienst |
| 3,503,166 A | 3/1970 | Lipper et al. |
| 3,507,085 A | 4/1970 | Kruschwitz |
| 3,563,627 A | 2/1971 | Whipps |
| 3,665,646 A | 5/1972 | Neimanns |
| 3,787,922 A | 1/1974 | Foy et al. |
| 3,895,215 A | 7/1975 | Gordon |
| 3,937,133 A | 2/1976 | Bertin et al. |
| 4,007,941 A | 2/1977 | Stancati |
| 4,218,079 A | 8/1980 | Arnoldt |
| 4,323,110 A | 4/1982 | Rubbright et al. |
| 4,347,782 A | 9/1982 | Hoecke |
| 4,467,584 A | 8/1984 | Crites et al. |
| 4,495,545 A | 1/1985 | Dufresne et al. |
| 4,496,186 A | 1/1985 | Tuchiya et al. |
| 4,522,669 A | 6/1985 | Nordin et al. |
| 4,541,219 A | 9/1985 | Parker |
| 4,592,602 A | 6/1986 | Kuster et al. |
| 4,745,016 A | 5/1988 | Hashimoto et al. |
| 4,774,631 A | 9/1988 | Okuyama et al. |
| 4,778,705 A | 10/1988 | Kuwabara |
| 4,791,980 A | 12/1988 | Hagar et al. |
| 4,859,143 A | 8/1989 | Larrabee et al. |
| 4,895,378 A | 1/1990 | Newquist et al. |
| 5,107,622 A | 4/1992 | Fuchs et al. |
| 5,123,874 A | 6/1992 | White, III |
| 5,165,770 A | 11/1992 | Hahn |
| 5,216,579 A | 6/1993 | Basara et al. |
| 5,250,752 A | 10/1993 | Cutright |
| 5,256,105 A | 10/1993 | Austin |
| 5,294,748 A | 3/1994 | Schwenk et al. |
| 5,460,441 A | 10/1995 | Hastings et al. |
| 5,488,543 A | 1/1996 | Mazura et al. |
| 5,528,454 A | 6/1996 | Niklos |
| 5,544,012 A | 8/1996 | Koike |
| 5,570,740 A | 11/1996 | Flores et al. |
| 5,639,150 A | 6/1997 | Anderson et al. |
| 5,671,805 A | 9/1997 | Stahl et al. |
| 5,695,263 A | 12/1997 | Simon et al. |
| 5,718,628 A | 2/1998 | Nakazato et al. |
| 5,791,498 A | 8/1998 | Mills |
| 5,806,945 A | 9/1998 | Anderson et al. |
| 5,851,143 A | 12/1998 | Hamid |
| 5,914,858 A | 6/1999 | McKeen et al. |
| 5,941,767 A | 8/1999 | Fukuda |
| 5,943,219 A | 8/1999 | Bellino et al. |
| 5,957,506 A | 9/1999 | Stepp |
| 5,995,368 A | 11/1999 | Lee et al. |
| 5,997,117 A | 12/1999 | Krietzman |
| 6,034,873 A | 3/2000 | Stahl et al. |
| 6,036,290 A | 3/2000 | Jancsek et al. |
| 6,044,193 A | 3/2000 | Szetesi et al. |
| 6,067,233 A | 5/2000 | English et al. |
| 6,070,363 A | 6/2000 | Vance |
| 6,104,003 A | 8/2000 | Jones |
| 6,127,663 A | 10/2000 | Jones |
| 6,163,454 A | 12/2000 | Strickler |
| 6,198,628 B1 | 3/2001 | Smith |
| 6,209,269 B1 | 4/2001 | Valderrama |
| 6,222,729 B1 | 4/2001 | Yoshikawa |
| 6,305,180 B1 | 10/2001 | Miller et al. |
| 6,321,490 B1 | 11/2001 | Vance |
| 6,364,374 B1 | 4/2002 | Noone et al. |
| 6,381,147 B1 | 4/2002 | Hayward et al. |
| 6,459,579 B1 | 10/2002 | Farmer et al. |
| 6,462,944 B1 | 10/2002 | Lin |
| 6,494,050 B2 | 12/2002 | Spinazzola et al. |
| 6,525,935 B2 | 2/2003 | Casebolt |
| 6,532,152 B1 | 3/2003 | White et al. |
| 6,554,697 B1 | 4/2003 | Koplin |
| 6,557,357 B2 | 5/2003 | Spinazzola et al. |
| 6,574,970 B2 | 6/2003 | Spinazzola et al. |
| 6,601,932 B1 | 8/2003 | Helgenberg et al. |
| 6,611,428 B1 | 8/2003 | Wong |
| 6,616,524 B2 | 9/2003 | Storck, Jr. et al. |
| 6,646,878 B2 | 11/2003 | Chan |
| 6,652,373 B2 | 11/2003 | Sharp et al. |
| 6,668,565 B1 | 12/2003 | Johnson et al. |
| 6,672,955 B2 | 1/2004 | Charron |
| 6,695,149 B1 | 2/2004 | Cote et al. |
| 6,704,196 B1 | 3/2004 | Rodriguez et al. |
| 6,745,579 B2 | 6/2004 | Spinazzola et al. |
| 6,788,535 B2 | 9/2004 | Dodgen et al. |
| 6,791,841 B1 | 9/2004 | Tirrell et al. |
| 6,819,563 B1 | 11/2004 | Chu et al. |
| 6,831,225 B2 | 12/2004 | Chandler |
| 6,854,284 B2 | 2/2005 | Bash et al. |
| 6,867,967 B2 | 3/2005 | Mok |
| 6,896,612 B1 | 5/2005 | Novotny |
| 6,912,131 B2 | 6/2005 | Kabat |
| 7,011,576 B2 | 3/2006 | Sharp et al. |
| 7,016,194 B1 | 3/2006 | Wong |
| 7,033,267 B2 | 4/2006 | Rasmussen |
| 7,074,123 B2 | 7/2006 | Bettridge et al. |
| 7,090,315 B1 | 8/2006 | Horne |
| 7,112,131 B2 | 9/2006 | Rasmussen et al. |
| 7,144,320 B2 | 12/2006 | Turek et al. |
| 7,154,748 B2 | 12/2006 | Yamada |
| 7,182,208 B2 | 2/2007 | Tachibana |
| 7,212,403 B2 | 5/2007 | Rockenfell |
| 7,226,353 B2 | 6/2007 | Bettridge et al. |
| 7,236,362 B2 | 6/2007 | Wang et al. |
| 7,255,640 B2 | 8/2007 | Aldag et al. |
| 7,259,961 B2 | 8/2007 | Lucero et al. |
| 7,259,963 B2 | 8/2007 | Germagian et al. |
| 7,286,345 B2 | 10/2007 | Casebolt |
| 7,293,666 B2 | 11/2007 | Mattlin et al. |
| 7,309,279 B2 | 12/2007 | Sharp et al. |
| 7,349,209 B2 | 3/2008 | Campbell et al. |
| 7,355,850 B2 | 4/2008 | Baldwin |
| 7,372,695 B2 | 5/2008 | Coglitore et al. |
| 7,425,678 B2 | 9/2008 | Adducci et al. |
| 7,427,713 B2 | 9/2008 | Adducci et al. |
| 7,430,118 B1 | 9/2008 | Noteboom et al. |
| 7,438,124 B2 | 10/2008 | Bhatti et al. |
| 7,438,638 B2 | 10/2008 | Lewis, II et al. |
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,486,512 B2 | 2/2009 | Campbell et al. |
| 7,495,169 B2 | 2/2009 | Adducci et al. |
| 7,498,512 B2 | 3/2009 | Adducci et al. |
| 7,500,911 B2 | 3/2009 | Johnson et al. |
| 7,504,581 B2 | 3/2009 | Adducci et al. |
| 7,506,768 B2 | 3/2009 | Rassmussen et al. |
| 7,508,663 B2 | 3/2009 | Coglitore et al. |
| 7,542,287 B2 | 6/2009 | Lewis, II et al. |
| 7,604,535 B2 | 10/2009 | Germagian et al. |
| 7,643,291 B2 | 1/2010 | Mallia et al. |
| 7,646,602 B1 | 1/2010 | Tamarkin et al. |
| 7,697,285 B2 | 4/2010 | Donowho et al. |
| 7,718,891 B2 | 5/2010 | Adducci et al. |
| 7,746,637 B2 | 6/2010 | Donowho et al. |
| 7,751,188 B1 | 7/2010 | French et al. |
| 7,752,858 B2 | 7/2010 | Johnson et al. |
| 7,764,495 B2 | 7/2010 | Hruby et al. |
| 7,772,489 B2 | 8/2010 | Adducci et al. |
| 7,795,532 B2 | 9/2010 | Walker |
| 7,800,900 B1 | 9/2010 | Noteboom et al. |
| 7,804,685 B2 | 9/2010 | Krietzman |
| 7,839,635 B2 | 11/2010 | Donowho et al. |
| 7,878,888 B2 | 2/2011 | Rasmussen et al. |
| 7,880,084 B2 | 2/2011 | Adducci et al. |
| 7,894,190 B2 | 2/2011 | Davis et al. |
| 7,944,692 B2 | 5/2011 | Grantham et al. |
| 7,952,869 B2 | 5/2011 | Lewis, II et al. |
| 7,957,139 B2 | 6/2011 | Davis et al. |
| 8,004,839 B2 | 8/2011 | Sato et al. |
| 8,035,965 B2 | 10/2011 | Adducci et al. |
| 8,040,673 B2 | 10/2011 | Krietzman |
| 8,087,979 B2 | 1/2012 | Rasmussen |

(56) References Cited

U.S. PATENT DOCUMENTS

| | | |
|---|---|---|
| 8,107,238 B2 | 1/2012 | Krietzman et al. |
| 8,217,315 B2 | 7/2012 | Suetsugu |
| 8,248,792 B2 | 8/2012 | Wei |
| 8,257,155 B2 | 9/2012 | Lewis, II |
| 8,395,046 B2 | 3/2013 | Nicewicz et al. |
| 8,403,736 B2 | 3/2013 | Rasmussen et al. |
| 8,425,287 B2 | 4/2013 | Wexler |
| 8,556,357 B2 | 10/2013 | Fan |
| 8,653,363 B2 | 2/2014 | Behrens et al. |
| 8,730,665 B2 | 5/2014 | Lewis, II et al. |
| 8,737,068 B2 | 5/2014 | Krietzman et al. |
| 8,867,206 B2 | 10/2014 | Hruby et al. |
| 8,888,158 B2 | 11/2014 | Slessman |
| 9,066,450 B2 | 6/2015 | Bednarcik et al. |
| 9,072,193 B1 | 6/2015 | Eichelberg |
| 9,084,369 B2 | 7/2015 | Lewis, II et al. |
| 9,119,329 B2 | 8/2015 | Krietzman et al. |
| 9,185,824 B2 | 11/2015 | Nordin et al. |
| 9,313,927 B2 | 4/2016 | Krietzman |
| 9,332,863 B2 | 5/2016 | Ramey et al. |
| 9,585,266 B2 | 2/2017 | Krietzman et al. |
| 9,801,309 B2 | 10/2017 | Krietzman et al. |
| 9,943,003 B2 | 4/2018 | Segroves et al. |
| 9,955,616 B2 | 4/2018 | Krietzman et al. |
| 10,123,462 B2 | 11/2018 | Krietzman et al. |
| 10,133,320 B2 | 11/2018 | Lewis, II et al. |
| 10,182,651 B2 | 1/2019 | Jost et al. |
| 10,334,761 B2 | 6/2019 | Krietzman et al. |
| 10,568,239 B2 | 2/2020 | Krietzman et al. |
| 10,568,246 B2 | 2/2020 | Krietzman et al. |
| 10,624,232 B2 | 4/2020 | Krietzman |
| 10,674,634 B2 | 6/2020 | Lewis, II et al. |
| 10,765,037 B2 | 9/2020 | Lewis, II et al. |
| 10,791,640 B2 | 9/2020 | Lewis, II et al. |
| 11,132,035 B2 | 9/2021 | Lewis, II |
| 11,166,395 B2 | 11/2021 | Krietzman |
| 11,212,928 B2 | 12/2021 | Lewis, II et al. |
| 11,259,446 B2 | 2/2022 | Lewis et al. |
| 11,444,438 B2 | 9/2022 | Schindler et al. |
| 11,464,132 B2 | 10/2022 | Krietzman |
| 11,547,020 B2 | 1/2023 | Lewis, II et al. |
| 11,622,469 B2 | 4/2023 | Waz et al. |
| 11,678,447 B2 | 6/2023 | Lewis, II et al. |
| 11,706,898 B2 | 7/2023 | Krietzman |
| 2001/0029163 A1 | 10/2001 | Spinazzola et al. |
| 2002/0007643 A1 | 1/2002 | Spinazzola et al. |
| 2002/0059804 A1 | 5/2002 | Spinazzola et al. |
| 2002/0101721 A1 | 8/2002 | Blood |
| 2002/0108386 A1 | 8/2002 | Spinazzola et al. |
| 2002/0149911 A1 | 10/2002 | Bishop et al. |
| 2002/0153725 A1 | 10/2002 | Myers |
| 2003/0034717 A1 | 2/2003 | Yao |
| 2003/0050003 A1 | 3/2003 | Charron |
| 2004/0007348 A1 | 1/2004 | Stoller |
| 2004/0050808 A1 | 3/2004 | Krampotich et al. |
| 2004/0099747 A1 | 5/2004 | Johnson et al. |
| 2004/0182799 A1 | 9/2004 | Tachibana |
| 2004/0190270 A1 | 9/2004 | Aldag et al. |
| 2004/0201335 A1 | 10/2004 | Davis |
| 2004/0223300 A1 | 11/2004 | Fink et al. |
| 2004/0257766 A1* | 12/2004 | Rasmussen ........ H05K 7/20736 |
| | | 361/689 |
| 2005/0029910 A1 | 2/2005 | Woods |
| 2005/0153649 A1 | 7/2005 | Bettridge et al. |
| 2005/0168945 A1 | 8/2005 | Coglitore |
| 2005/0170770 A1 | 8/2005 | Johnson et al. |
| 2005/0207116 A1 | 9/2005 | Yatskov et al. |
| 2005/0225936 A1 | 10/2005 | Day |
| 2005/0248043 A1 | 11/2005 | Bettridge et al. |
| 2005/0280986 A1 | 12/2005 | Coglitore et al. |
| 2005/0286222 A1* | 12/2005 | Lucero ............... H05K 7/20563 |
| | | 415/182.1 |
| 2006/0103270 A1 | 5/2006 | Bergesch et al. |
| 2006/0141921 A1 | 6/2006 | Turek et al. |
| 2006/0144572 A1 | 7/2006 | Yu et al. |
| 2006/0276121 A1 | 12/2006 | Rasmussen |
| 2006/0283816 A1 | 12/2006 | Moore et al. |
| 2007/0064389 A1 | 3/2007 | Lewis, II et al. |
| 2007/0064391 A1 | 3/2007 | Lewis, II et al. |
| 2007/0107871 A1 | 5/2007 | Xia et al. |
| 2007/0129000 A1 | 6/2007 | Rasmussen et al. |
| 2007/0171610 A1 | 7/2007 | Lewis |
| 2007/0171613 A1 | 7/2007 | McMahan et al. |
| 2007/0173189 A1 | 7/2007 | Lewis |
| 2007/0183129 A1 | 8/2007 | Lewis, II et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0254583 A1 | 11/2007 | Germagian et al. |
| 2007/0259616 A1 | 11/2007 | Scattolin et al. |
| 2007/0293138 A1 | 12/2007 | Adducci et al. |
| 2008/0002358 A1 | 1/2008 | Casebolt |
| 2008/0007911 A1 | 1/2008 | Hallin et al. |
| 2008/0035810 A1 | 2/2008 | Lewis, II |
| 2008/0037228 A1 | 2/2008 | Lewis, II |
| 2008/0062654 A1 | 3/2008 | Mattlin et al. |
| 2008/0067904 A1 | 3/2008 | Adducci et al. |
| 2008/0068791 A1 | 3/2008 | Ebermann |
| 2008/0074849 A1 | 3/2008 | Adducci et al. |
| 2008/0094797 A1 | 4/2008 | Coglitore et al. |
| 2008/0098763 A1 | 5/2008 | Yamaoka |
| 2008/0134745 A1 | 6/2008 | Hermanson |
| 2008/0174217 A1 | 7/2008 | Walker |
| 2008/0174954 A1 | 7/2008 | VanGilder et al. |
| 2008/0180908 A1 | 7/2008 | Wexler |
| 2008/0212265 A1 | 9/2008 | Mazura et al. |
| 2008/0266789 A1 | 10/2008 | Hruby et al. |
| 2008/0285232 A1 | 11/2008 | Claassen et al. |
| 2008/0316702 A1 | 12/2008 | Donowho et al. |
| 2008/0316703 A1 | 12/2008 | Donowho et al. |
| 2009/0021907 A1 | 1/2009 | Mann et al. |
| 2009/0059523 A1 | 3/2009 | Mallia et al. |
| 2009/0061755 A1 | 3/2009 | Calder et al. |
| 2009/0086432 A1 | 4/2009 | Campbell et al. |
| 2009/0122483 A1 | 5/2009 | Hall |
| 2009/0129013 A1 | 5/2009 | Donowho et al. |
| 2009/0190307 A1 | 7/2009 | Krietzman |
| 2009/0227197 A1 | 9/2009 | Lewis, II et al. |
| 2009/0239460 A1 | 9/2009 | Lucia et al. |
| 2009/0239461 A1 | 9/2009 | Lewis, II et al. |
| 2009/0273915 A1 | 11/2009 | Dean, Jr. et al. |
| 2010/0003911 A1 | 1/2010 | Graczyk et al. |
| 2010/0027216 A1 | 2/2010 | Matsushima et al. |
| 2010/0061059 A1 | 3/2010 | Krietzman et al. |
| 2010/0085707 A1 | 4/2010 | Moss |
| 2010/0114356 A1 | 5/2010 | Schmitt et al. |
| 2010/0172092 A1 | 7/2010 | Davis et al. |
| 2010/0172093 A1 | 7/2010 | Davis et al. |
| 2010/0178202 A1 | 7/2010 | Isobe et al. |
| 2010/0248610 A1 | 9/2010 | Caveney et al. |
| 2010/0252233 A1 | 10/2010 | Absalom |
| 2011/0019362 A1 | 1/2011 | Krietzman |
| 2011/0205705 A1 | 8/2011 | Graybill et al. |
| 2011/0222241 A1 | 9/2011 | Shearman et al. |
| 2011/0237174 A1 | 9/2011 | Felisi et al. |
| 2011/0278250 A1 | 11/2011 | Malekmadani |
| 2011/0287704 A1 | 11/2011 | Lewis, II et al. |
| 2011/0290553 A1 | 12/2011 | Behrens et al. |
| 2011/0307102 A1 | 12/2011 | Czamara et al. |
| 2012/0013229 A1 | 1/2012 | Krietzman |
| 2012/0049706 A1 | 3/2012 | Cottuli et al. |
| 2012/0063087 A1 | 3/2012 | Wei |
| 2012/0071076 A1 | 3/2012 | Wei et al. |
| 2012/0080984 A1 | 4/2012 | Watts |
| 2012/0112612 A1 | 5/2012 | Krietzman |
| 2012/0194999 A1 | 8/2012 | Krietzman et al. |
| 2012/0292278 A1 | 11/2012 | Schluter et al. |
| 2013/0029579 A1 | 1/2013 | Lewis, II |
| 2013/0160271 A1 | 6/2013 | Krietzman et al. |
| 2013/0163185 A1 | 6/2013 | Gilges et al. |
| 2013/0165035 A1 | 6/2013 | Krietzman et al. |

(56) References Cited

U.S. PATENT DOCUMENTS

| | | |
|---|---|---|
| 2013/0309957 A1 | 11/2013 | Fleming et al. |
| 2014/0323029 A1 | 10/2014 | Lewis, II et al. |
| 2014/0334099 A1 | 11/2014 | Krietzman et al. |
| 2015/0065028 A1 | 3/2015 | Krietzman |
| 2015/0208554 A1 | 7/2015 | Leigh et al. |
| 2015/0351289 A1 | 12/2015 | Krietzman et al. |
| 2016/0066478 A1 | 3/2016 | Van Den Bergen |
| 2016/0249488 A1 | 8/2016 | Krietzman |
| 2016/0302317 A1 | 10/2016 | Lewis, II et al. |
| 2017/0127569 A1 | 5/2017 | Rimler et al. |
| 2018/0042143 A1 | 2/2018 | Krietzman et al. |
| 2018/0110154 A1 | 4/2018 | Mayer et al. |
| 2018/0263127 A1 | 9/2018 | Lewis, II et al. |
| 2019/0073004 A1 | 3/2019 | Lewis, II |
| 2019/0313551 A1 | 10/2019 | Krietzman et al. |
| 2019/0343023 A1 | 11/2019 | Lewis, II et al. |
| 2019/0350108 A1 | 11/2019 | Davis |
| 2019/0350110 A1 | 11/2019 | Krietzman |
| 2020/0077533 A1 | 3/2020 | Lu et al. |
| 2020/0113074 A1 | 4/2020 | Lewis, II et al. |
| 2020/0187387 A1 | 6/2020 | Lewis, II et al. |
| 2020/0205317 A1 | 6/2020 | Davis |
| 2020/0245494 A1 | 7/2020 | Krietzman |
| 2020/0396868 A1 | 12/2020 | Lewis, II et al. |
| 2021/0014988 A1 | 1/2021 | Lewis, II et al. |
| 2022/0053672 A1 | 2/2022 | Krietzman |
| 2022/0124924 A1 | 4/2022 | Lewis, II et al. |
| 2022/0183190 A1 | 6/2022 | Lewis, II et al. |
| 2023/0014492 A1 | 1/2023 | Krietzman |
| 2023/0156974 A1 | 5/2023 | Lewis, II et al. |

FOREIGN PATENT DOCUMENTS

| | | |
|---|---|---|
| DE | 2509487 A1 | 9/1976 |
| DE | 19728306 A1 | 1/1999 |
| EP | 2205054 A1 | 7/2010 |
| GB | 2354066 A | 3/2001 |
| GB | 2366084 B | 9/2002 |
| JP | 2000-193792 A | 7/2000 |
| JP | 2000-286580 | 10/2000 |
| JP | 2003-056993 A | 2/2003 |
| JP | 2004-200594 | 7/2004 |
| JP | 2004-252758 | 9/2004 |
| JP | 2007-212092 A | 8/2007 |
| TW | 201630514 A | 8/2016 |
| WO | 1999048305 | 9/1999 |
| WO | 2002054552 A1 | 7/2002 |
| WO | 2006055506 A2 | 5/2006 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009103090 A2 | 8/2009 |
| WO | 2009103090 A3 | 10/2009 |
| WO | 2010028384 A2 | 3/2010 |
| WO | 2010117699 A1 | 10/2010 |

OTHER PUBLICATIONS

Information Disclosure Statement (IDS) Letter Regarding Common Patent Application(s), dated Jun. 23, 2022.

Information Disclosure Statement (IDS) Letter Regarding Common Patent Application(s), dated Jan. 11, 2022.

"International Search Report" and "Written Opinion of the International Searching Authority" (ISA/US) in Chatsworth Products, Inc. et al., International Patent Application Serial No. PCT/US2007/075763, dated Aug. 13, 2008 (13 pages).

"International Search Report" and "Written Opinion of the International Search Authority" (European Patent Office) in Corning Cable Systems LLC, International Patent Application Serial No. PCT/US2009/000075, dated Aug. 7, 2009 (21 pages).

"International Search Report" and "Written Opinion" of the International Search Authority (Korean Intellectual Property Office) in Chatsworth Products, Inc. et al., International Patent Application Serial No. PCT/US2009/034338, dated Sep. 1, 2009 (7 pages).

"International Search Report" and "Written Opinion of the International Search Authority" (Korean Intellectual Property Office) in Chatsworth Products, Inc. et al., International Patent Application Serial No. PCT/US2009/056256, dated Apr. 7, 2010 (7 pages).

Rasmussen, Neil, "Air Distribution Architecture Options for Mission Critical Facilities", White Paper #55, Revision 1, American Power Conversion (APC), West Kingston, Rhode Island, 2003 (13 pages).

Chatsworth Products, Inc., "Thermal Management Solutions," Signature Solutions Brochure, available at Internet Web Page <www.chatsworth.com/passivecooling>, dated Mar. 2008 (6 pages).

Rack Technologies PTY Ltd, Product Catalog, Internet Web Page <http://racktechnologies.com.au/files/rt2005.pdf>, Jun. 16, 2005, retrieved from Internet Archive Wayback Machine <http://web.archive.org/web/20050616212856/http://racktechnologies.com.au/files/rt2005.pdf> as reviewed as of Apr. 29, 2016 (73 pages).

Emerson Network Power, Smart Cooling Solutions Data Center, Oct. 2012, Internet Web Page <http://www.emersonnetworkpower.com/en-EMEA/Products/RACKSANDINTEGRATEDCABINETS/Documents/Knurr%20DCD/Smart-Cooling-Solutions-Data-Center-EN.pdf> (51 pages).

Hewlett-Packard Development Company, LP, HP 10000 G2 42U Rack Air Duct Installation Guide, dated Aug. 2008 (23 pages).

Information Disclosure Statement (IDS) Letter Regarding Common Patent Application(s), dated Mar. 16, 2023.

* cited by examiner

AIR DIRECTING DEVICE

CROSS-REFERENCE TO RELATED APPLICATIONS

The present application is a U.S. continuation patent application of, and claims priority under 35 U.S.C. § 120 to, U.S. nonprovisional patent application Ser. No. 16/182,276, filed Nov. 6, 2018, which '276 application published as U.S. Patent Application Publication No. US 2019/0073004 A1 on Mar. 7, 2019, which '276 application issued as U.S. Pat. No. 11,132,035 on Sep. 28, 2021, which '276 application, the application publication thereof, and the patent issuing therefrom are each incorporated by reference herein in their entirety, and which '276 application is a U.S. nonprovisional patent application of, and claims priority under 35 U.S.C. § 120 to, U.S. nonprovisional patent application Ser. No. 12/372,738, filed Feb. 17, 2009, which '738 application published as U.S. Patent Application Publication No. US 2009/0227197 A1 on Sep. 10, 2009, which '738 application issued as U.S. Pat. No. 10,133,320 on Nov. 20, 2018, which '738 application, the application publication thereof, and the patent issuing therefrom are each incorporated by reference herein in their entirety, and which '738 application is a U.S. nonprovisional patent application of, and claims priority under 35 U.S.C. § 119(e) to, U.S. provisional patent application Ser. No. 61/028,620, filed Feb. 14, 2008 and entitled, "AIR DIRECTING DEVICE," which '620 application is incorporated by reference herein in its entirety.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

Field of the Present Invention

The present invention relates generally to enclosures for electronic equipment, and, in particular, to thermal management in enclosures for rack-mount computer and data storage equipment.

Background

Racks, frames and enclosures for mounting and storing computer and other electronic components or equipment have been well known for many years. Racks and frames are typically simple rectangular frameworks on which electronic components may be mounted, or on which other mounting members, such as shelves or brackets, may be mounted which in turn may support the electronic components. Enclosures are typically frames on which panels or doors, or both, are hung to provide aesthetic improvement, to protect the components from external influences, to provide security for the components stored inside, or for other reasons.

Racks, frames and enclosures have been built in many different sizes and with many different proportions in order to best accommodate the components which they are designed to store. Components stored in these enclosures may include audio and video equipment and the like, but quite frequently include computer equipment and related peripheral devices. These components typically include housings enclosing internal operative elements.

As is also well known, the electronic equipment mounted therein tends to generate large amounts of thermal energy that needs to be exhausted away from the equipment effectively in order to maintain the equipment in proper operating order or to prevent damage thereto. The problem can be especially significant when the components are enclosed in enclosures, because thermal energy generated thereby can concentrate within the equipment enclosure and cause the components to overheat and shut down. As equipment becomes more densely packed with electronics, the quantities of thermal energy have continued to increase in recent years, and thermal energy management has become a significant issue confronting today's rack, enclosure, frame and enclosure manufacturers, the manufacturers of the electronic equipment, and the users of such equipment.

Typically, multiple racks, frames, enclosures, and the like (sometimes collectively referred to hereinafter as "enclosures") are housed together in a data center. Because of the overheating problem, and particularly with multiple enclosures being placed in a single room or other enclosed space, thermal management of the data center is very important. A goal of data center thermal management is to maximize the performance, uptime and life expectancy of the active components being housed in the data center. This goal is generally accomplished by managing the cold air delivered to each component, and the hot air removed therefrom, such that the internal temperature of the component does not exceed the manufacturer's maximum allowable operating temperature. Preferably, the cold air delivered to the component is at or below the manufacturer's recommended temperature and in sufficient volume to meet the airflow requirements of the component, which are typically measured in cubic feet per minute (CFM).

The supply of cool air to the enclosures, and the transfer of thermal energy from the electronic equipment, is conventionally handled by the Computer Room Air Conditioner ("CRAC"). Airflow into the enclosures generally relies solely or at least primarily on the air pressure differential as measured between a raised floor plenum and the ambient room. However, active means are often used to push or pull heated air out of the enclosures.

For a particular component, thermal energy is transferred from its housing using forced air convection. More specifically, internal fans may draw or push air through the housing from front-to-rear or from side-to-side over the heated internal elements within the housing. The air absorbs the thermal energy from the internal elements and carries it away as it exits the housing.

Two common problems that affect thermal management of equipment enclosures are recirculation and bypass. Recirculation occurs when hot exhaust air travels back into the component intake air stream. Recirculation can occur for a single component or for an entire enclosure. When this occurs, the exhaust airflow raises intake air temperatures and causes components to run at higher operating temperatures. Bypass occurs when cold source air bypasses the active component and travels directly into the hot exhaust air stream. Similarly to recirculation, bypass may occur for a single component or for a whole enclosure. Because cold source air is bypassing the active component, the air is not serving its intended purpose of transferring thermal energy away from the active component. As such, the bypassing air is essentially wasted, and the active component retains its thermal energy until additional cold source air contacts the active component thereby transferring the thermal energy away from the component. Based on the foregoing, it is readily apparent that bypass wastes energy. In addition, bypass contributes to humidity control problems, and can indirectly contribute to recirculation. Under ideal circumstances, all recirculation and bypass airflow can be eliminated.

Often it is difficult for side breathing, or transversely aspirated, equipment to collect inlet cooling air in a conventionally configured enclosure having a perforated or open front or back panel but having closed side panels. Typically, air enters the enclosure through perforated metal front and rear doors. As shown schematically in FIG. 1A, the airflow is routed around the enclosure frame structure, along the side space of the enclosure and around bundles of network cables (not shown) located there before turning in a generally orthogonal direction in order to enter into the equipment intake. The high velocity or momentum of the air as it makes the orthogonal turn typically generates a swirl pattern (or vortex) in the network equipment chassis. The air vortex creates the problem of recirculation that was described above. As shown in FIG. 1B, temperatures in the vicinity of a vortex zone (with temperature zones being shown by the dashed lines), and thus the temperatures of equipment located in such an area, are typically significantly higher due to the reduced heat removal associated with recirculation. More particularly, the temperature in side areas 142 is higher than the temperature in the area 140 near the intake, which is to be expected, but the air in the center of the vortex 144 is considerably higher, perhaps dangerously so, than in the other areas 140,142. Typically, imposed recirculation in fully enclosed equipment enclosures having side breathing equipment installed therein is not considered from a thermal management perspective.

Although some attention has been given to the cooling of side breathing equipment, most of this work has been focused on the containment and directing of hot exhaust air out of the enclosure. When inlet air for side breathing equipment has been addressed, the side breathing equipment has been placed in a enclosure with a vented side panel or with the side panel removed. Additionally, side breathing equipment has sometimes been installed in an open frame having no panels at all. While these solutions are valuable, it is not always possible to place side breathing equipment in a enclosure with no side panel or in an enclosure with no panels whatsoever. Accordingly, a need exists for a thermal management solution for side breathing equipment involving a more conventional enclosed enclosure.

SUMMARY OF THE PRESENT INVENTION

The present invention includes many aspects and features. Moreover, while many aspects and features relate to, and are described in, the context of enclosures for storage of electronic equipment, the present invention is not limited to use only in enclosures for storage of electronic equipment, as will become apparent from the following summaries and detailed descriptions of aspects, features, and one or more embodiments of the present invention.

Accordingly, one aspect of the present invention relates to an air directing device for thermal management in side breathing equipment. An exemplary such device includes at least three vertical panels disposed in generally parallel relationship and horizontally spaced a fixed distance from one another, each panel defining a fin arranged orthogonally relative to an airflow path for deflection of cooling air into side breathing equipment, wherein at least one of the panels is an inner panel that is wider than two outer panels. Furthermore, at least one connection member connecting the outer panels to one another.

In a feature of this aspect of the invention, the at least one connection member is two connection plates, each positioned at opposing ends of the panels. In a further feature, each connection plate has a T shape. In yet a further feature, a length of a cross portion of each T shaped connection plate is measured as a first distance between the outer panels, and a length of a trunk portion of each T shaped connection plate is the width of the inner panel.

In another feature of this aspect, the at least three vertical panels are three vertical panels. In yet another feature, the at least three vertical panels are four vertical panels. Alternatively, the panels include two front panels and two rear panels. In yet another feature, the two front panels mirror the two back panels. In yet another feature, the at least three vertical panels include two inner panels. In alternatives of this feature, the two inner panels are the same width and the two outer panels are the same width.

Another aspect of the invention relates to an electronic equipment enclosure. An exemplary such enclosure includes an air directing device disposed in a side space of the enclosure having at least two vertical panels of differing widths disposed a fixed horizontal distance from one another. Furthermore, in this aspect of the invention, a first panel of the at least two vertical panels directs a first portion of airflow through a side space in the enclosure toward side breathing equipment mounted in the enclosure but permits a second portion of airflow through the side space to pass by. Still yet in this aspect, a second panel of the at least two vertical panels directs at least a portion of the second portion of airflow toward the side breathing equipment.

In a feature of this aspect of the invention, the at least two vertical panels are disposed in parallel relationship to the front and rear of the enclosure. Alternatively, the air directing device includes three vertical panels. In another feature of this aspect of the invention, the air directing device includes four vertical panels. In yet another feature, the air directing device is mounted to internal structural members of the enclosure. Alternatively, the air directing device is mounted to a side panel of the enclosure or is aligned with an air intake grille of the side breathing equipment mounted in the enclosure.

Another aspect of the present invention relates to a method of directing airflow within an enclosure having electronic equipment mounted therein. An exemplary such method includes an air directing device having at least two vertical panels of different widths in a side space formed between the electronic equipment and a side panel of the enclosure; routing airflow into at least a front or a rear of the enclosure and then into the side space; directing a first portion of the airflow, using a first panel of the at least two vertical panels, toward the equipment but permitting a second portion of the airflow to pass by; and directing at least a portion of the second portion of the airflow, using the second panel of the at least two vertical panels, toward the equipment.

In features of this aspect of the invention, the electronic equipment is side breathing electronic equipment having at least one air intake grille facing the side space, and wherein the directing steps include directing the respective portions of the airflow toward the at least one air intake grille. In a further feature of this aspect of the invention, the air directing device has at least three vertical panels of at least two different widths in the side space, the at least three vertical panels defining at least one inner panel and at least two outer panels, with the inner panel being wider than an outer panel.

In addition to the aforementioned aspects and features of the present invention, it should be noted that the present invention further encompasses the various possible combinations and subcombinations of such aspects and features.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1A:
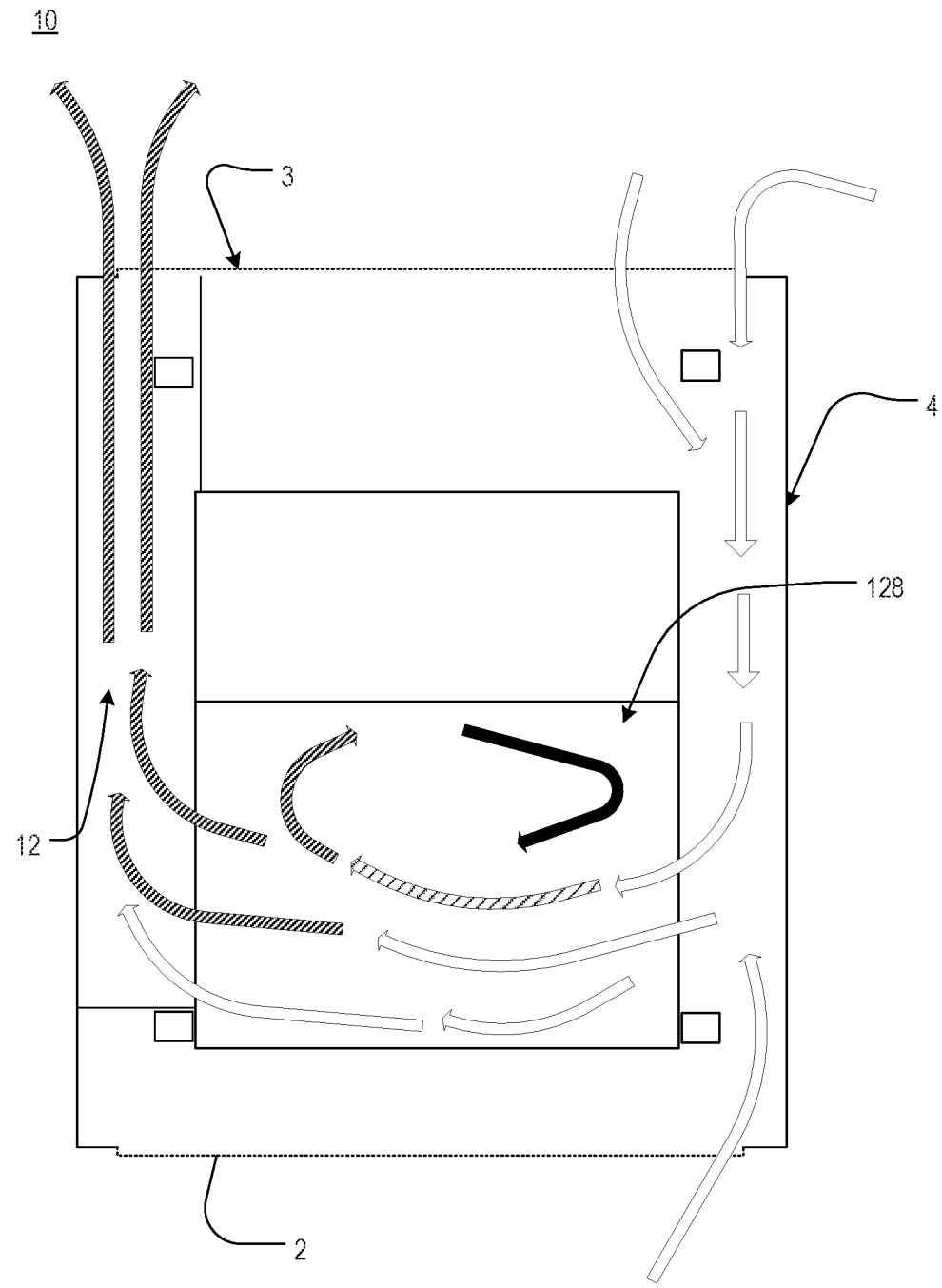
FIG. 1A is a schematic diagram illustrating a top view of a conventional enclosed enclosure having side breathing equipment installed therein showing a temperature diagram of the air flowing through the enclosure.
Figure 1B:
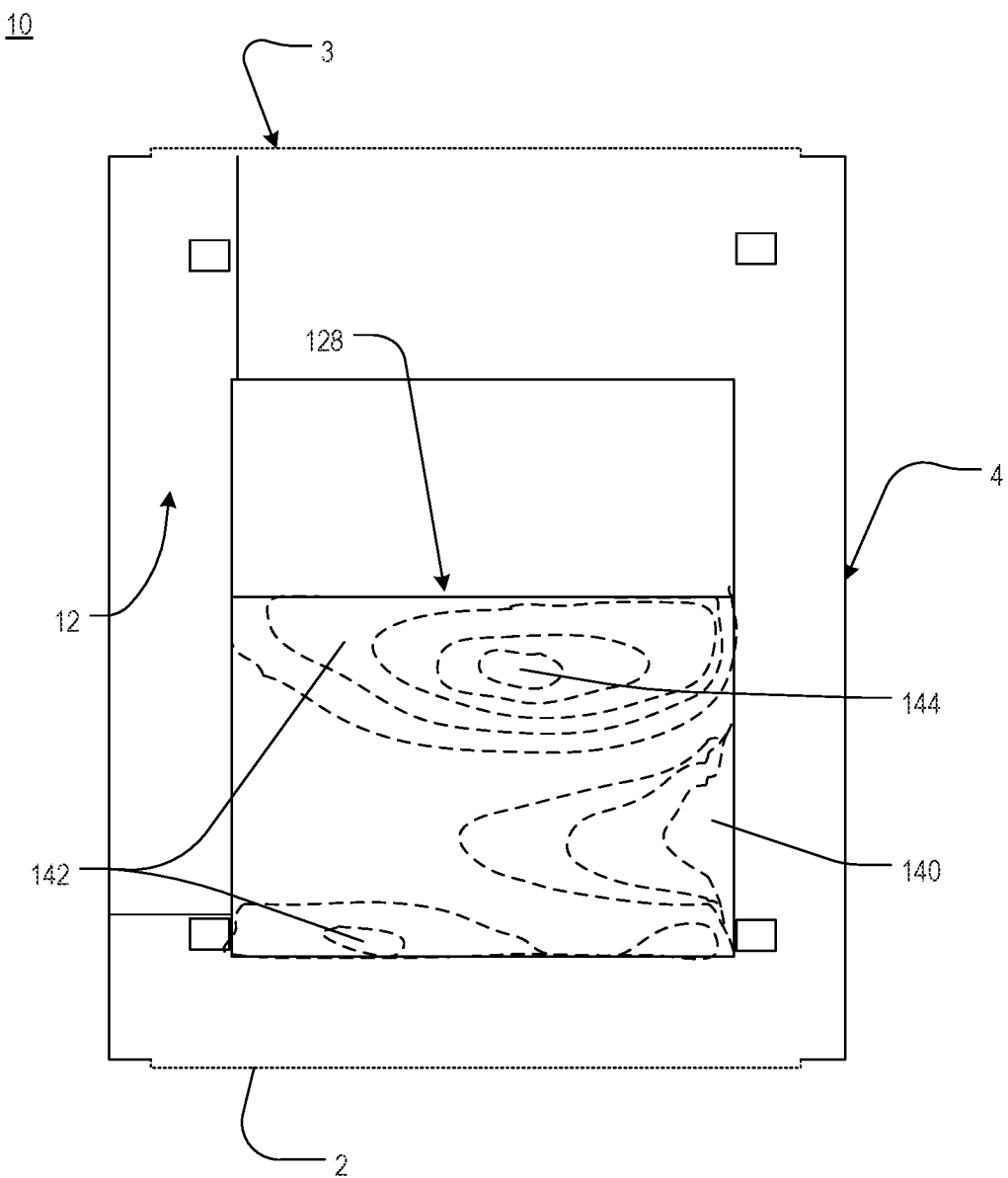
FIG. 1B is a computer simulation of the temperature inside a conventional enclosed enclosure, having side breathing equipment installed therein, as seen from inside the enclosure looking downward.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

Figure 2A:
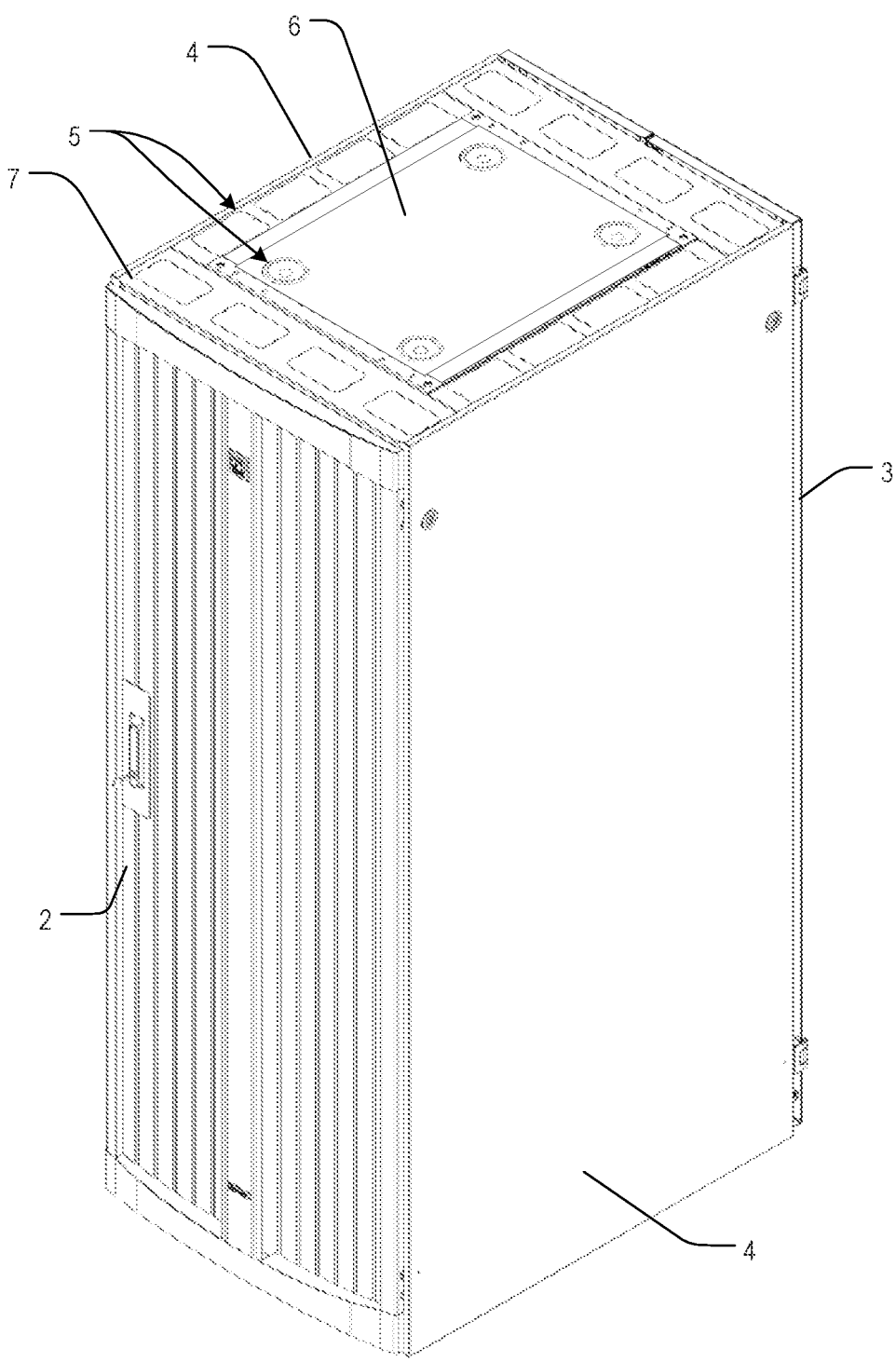
FIG. 2A is an isometric view of an electronic equipment enclosure system having an air directing device in accordance with one or more preferred embodiments of the present invention.
Figure 2B:
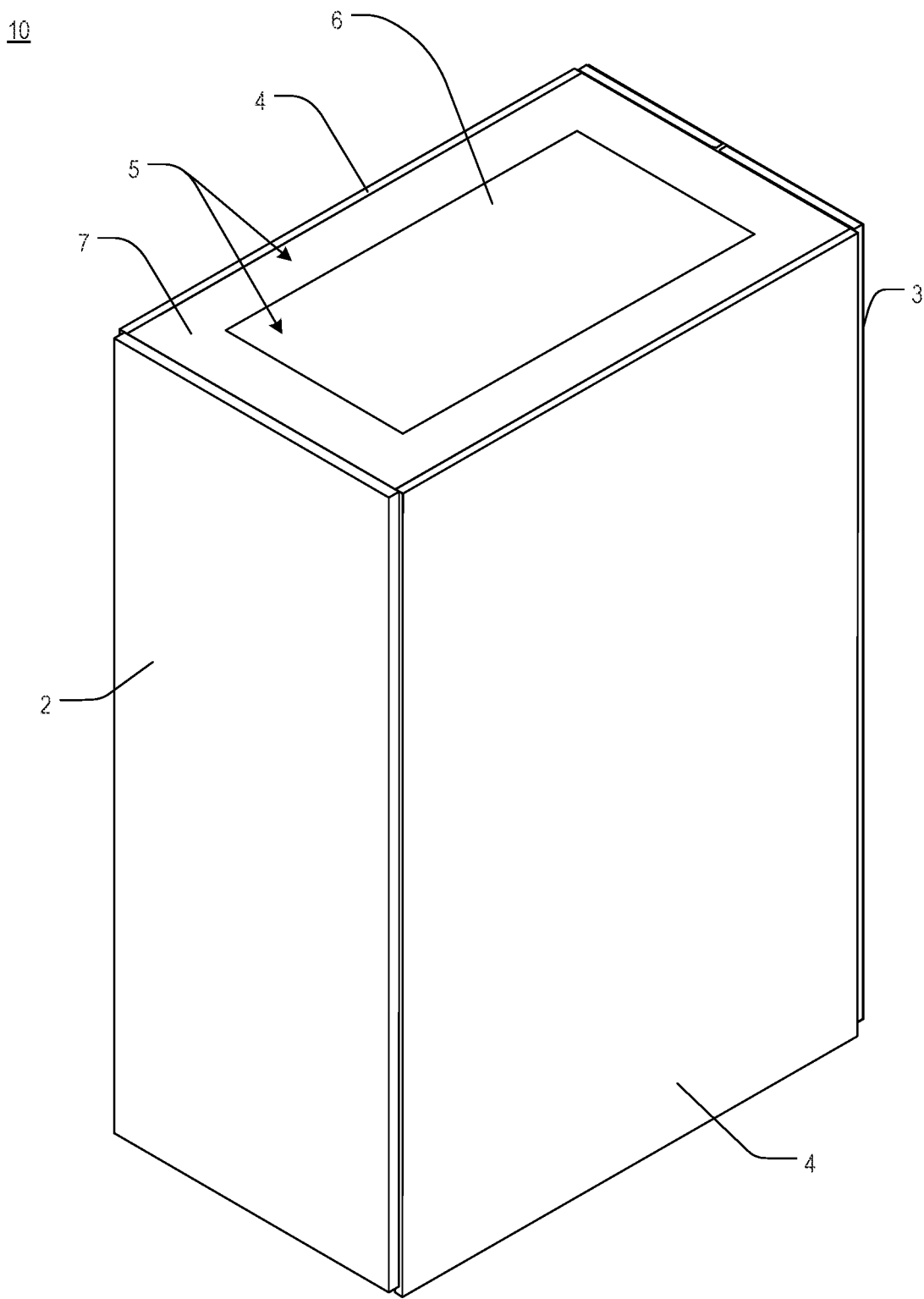
FIG. 2B is an isometric schematic view of the enclosure system of FIG. 2A.

FIG. 2A is an isometric view of an electronic equipment enclosure system 10 having an air directing device 112 in accordance with one or more preferred embodiments of the present invention, and FIG. 2B is an isometric schematic view of the enclosure system 10 of FIG. 2A. As shown therein, the enclosure system 10, which may be generally conventional, includes a front panel 2, a rear panel 3, a pair of side panels 4 and a top panel 5. In the illustrated embodiment, the front panel 2 is implemented as a single hinged door and the back panel 3 is implemented as a pair of hinged doors. In this regard, it will be apparent that various replacement components may be substituted for the components of the enclosure system, without departing from the scope of the present invention.

Furthermore, in the illustrated embodiment, the top panel 5 is illustrated as a central top panel 6 and a top panel extension kit 7, wherein the top panel extension kit 7 may include a plurality of top panel elements that are each co-planar with the central top panel 6, but other arrangements will be apparent to the Ordinary Artisan.

Figure 3A:
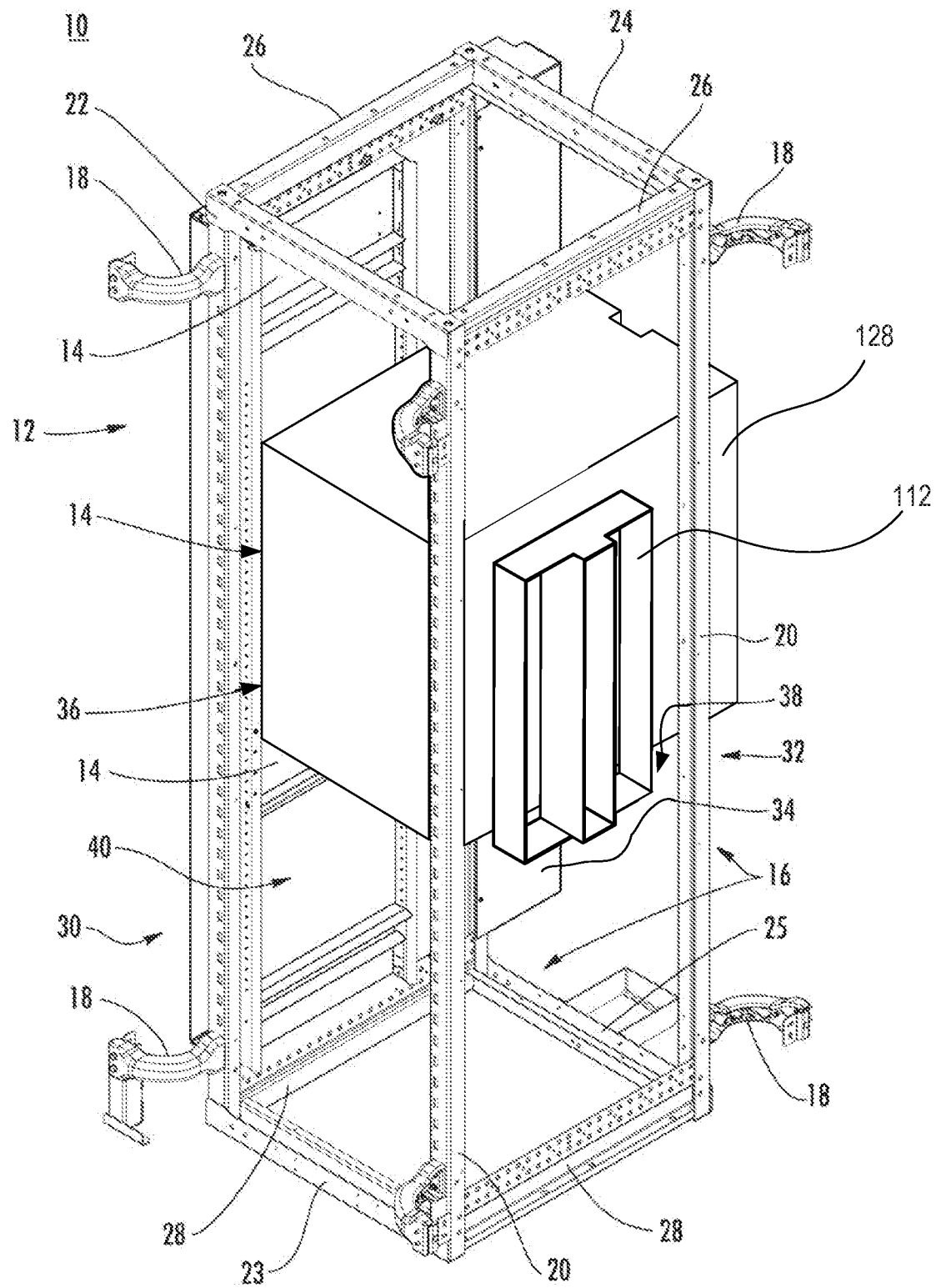
FIG. 3A is a front orthogonal view of the electronic equipment enclosure of FIG. 1, shown with the doors and panels removed, illustrating the air directing device installed therein.
Figure 3B:
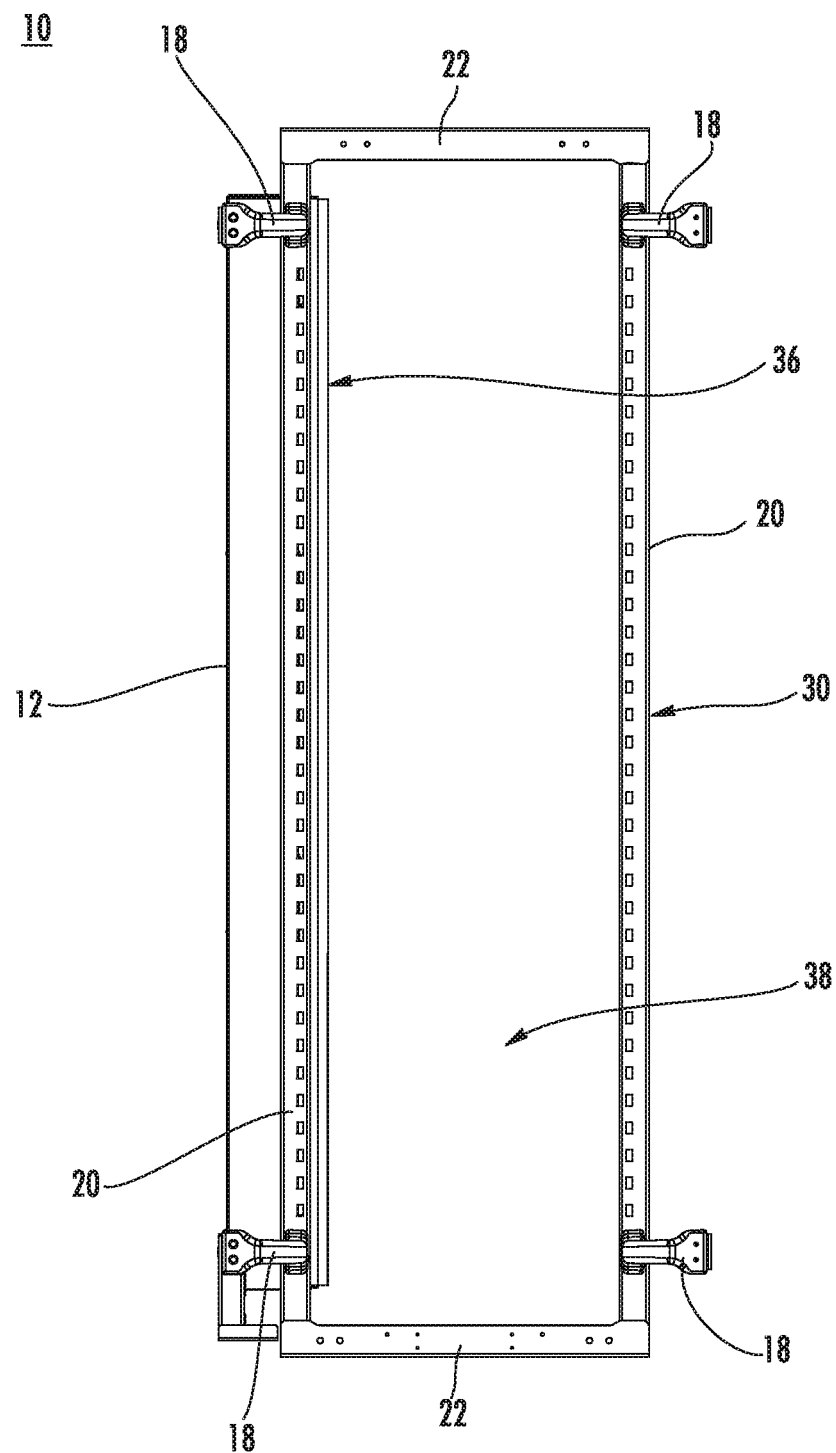
FIG. 3B is a front plan view of the electronic equipment enclosure of FIG. 3A, shown with the air directing device removed.

FIG. 3A is a front orthogonal view of the electronic equipment enclosure of FIGS. 2A and 2B, shown with the doors and panels removed, illustrating the air directing device installed therein, and FIGS. 3B-3F are various views of the electronic equipment enclosure 10 of FIG. 3A, shown with the air directing device 112 removed. FIGS. 3A-3F illustrate various components included or utilizable in one or more implementations of the present invention. As shown therein, the various panels are supported by a four post frame structure 16. The panels may form part of an enclosure expansion kit of the type shown and described in commonly-assigned U.S. patent application Ser. No. 11/837,537, published as U.S. Ser. No. 08/0035810 and entitled "OFFSET BRACKETS FOR EXPANDING ELECTRONIC EQUIPMENT CABINETS," the entirety of each of which is incorporated herein by reference. As further described in the Ser. No. 11/837,537 application, the enclosure expansion kit may include a plurality of offset brackets 18 and one or more center support brackets 19. Alternatively, the enclosure may be a traditional enclosure (not shown) in which the various panels, including front and/or rear doors panels, are disposed directly adjacent the frame structure instead of being supported by offset support brackets 18.

Although some of the brackets shown in U.S. patent application Ser. No. 11/837,537 are not the same as those shown in the present invention, it will be appreciated that any such bracket may be utilized without departing from the scope of the present invention. Furthermore, the concept of an expanded equipment enclosure is aptly shown therein and the Ordinary Artisan will understand how an expansion kit with the brackets 18 shown herein would work. In summary, eight offset brackets 18 are attached to the four post frame structure 16 for mounting of panels associated with the expansion kit. In the present invention, the brackets 18 are designed so as not to intrude into the spaces created in the sides of the enclosure 10 between the four post frame structure 16 and the panels of the expansion kit. As will be described more fully below, the spaces in the sides of the enclosure 10 between the four post frame structure 16 and the side panels of the expansion kit may be filled by internal exhaust ducts 12, an example of which is shown on the left side of the enclosure 10 in FIGS. 3A-3F.

The interior four post frame structure 16 may be of conventional design and construction, such as that shown in U.S. patent application Ser. No. 11/837,537, and in fact the present invention is perhaps most applicable to, and useful with, conventional four post frame structures. As shown and described, the four post frame structure 16 includes four vertical members 20, upper and lower front cross members 22,23 upper and lower rear cross members 24,25, a pair of upper side cross members 26 and a pair of lower side cross members 28. A plurality of cross member attachment apertures are arranged at each end of each vertical member 20. Two of the vertical members 20 are connected together at their upper and lower ends by the upper and lower front cross members 22,23, respectively, and the other two vertical members 20 are connected together at their upper and lower ends by the upper and lower rear cross members 24,25, respectively. The front cross members 22,23 and their respective vertical members 20 thus define a front frame 30, and the rear cross members 24,25 and their respective vertical members 20 define a rear frame 32. The front and rear frames 30,32 may then be connected together at their respective corners by the upper and lower side cross members 26,28.

Any known connection means may be used to join the various members together. Although not illustrated herein, at least one example of conventional connection means is described in commonly-assigned U.S. Pat. No. 6,185,098, entitled "CO-LOCATION SERVER CABINET," the entirety of which is incorporated herein by reference. Although likewise not illustrated herein, the precision and the stability of each of the corners of at least some types of four post frame structures may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

A four post frame structure 16 may further comprise horizontal mounting rails with each horizontal mounting rail including two rows of mounting apertures extending along its entire length. Optionally, vertical mounting rails (not shown) may be mounted to the horizontal mounting rails. Each vertical mounting rail preferably includes a series of evenly-spaced, threaded mounting apertures, extending along substantially its entire length, for use in mounting electronic components and equipment, peripheral devices, cable brackets, additional mounting members, or the like thereto.

The internal exhaust duct 12 is disposed between a side of the four post frame structure 16 and a side panel 6 of the expansion kit. The internal exhaust duct 12 may be positioned on either the left or right side of the enclosure 10, depending on the side of the enclosure 10 through which it is desired for exhaust air to be removed. Based on the placement of the internal exhaust duct 12, one of ordinary skill in the art will understand that the internal exhaust duct 12 and adjustable panel assemblies 14 as described herein are perhaps most useful when used in conjunction with equipment through which air flows in a side to side direction, i.e., cool air intake on one side and exhaust air release on the other side, rather than equipment through which air flows in a front to back direction. However, it will be appreciated that similar adjustable panel assemblies may likewise be utilized with air ducts that are located in the front or rear of an enclosure as well without departing from the scope of the present invention. As shown in FIGS. 3A-3F, the duct 12 extends along the full height of the enclosure 10. However, in at least some embodiments, the duct 12 may extend only a portion of the height of the enclosure 10.

As is shown, a rear portion of the exhaust duct 12, having a rear opening 34 extends beyond the rear frame 32 of the four post frame structure 16. The rear opening 34 in the rear portion enables exhaust air to flow therethrough. Although not shown, the rear portion may abut the back panel 4 of the enclosure expansion kit; thus, exhaust air may flow through the rear opening 34 of the exhaust duct 12 and out through or past the back panel 4 of the enclosure 10. In at least some embodiments, exhaust air may flow through the rear opening 34 and out through perforations (not shown) in the back panel 4. Additionally, the rear opening 34 of the exhaust duct 12 may be located at any point along the height of the duct 12 or the rear opening 34 may open at the top or bottom of the duct 12.

The exhaust duct 12 also includes a generally rectangular shaped inlet opening 36 (perhaps most fully appreciated in FIG. 4B) into the interior 38 of the enclosure 10 that is preferably located near the front frame 30 of the enclosure 10 and extends substantially the entire height thereof. However, in at least some embodiments, the inlet opening 36 is located near the rear frame 32, while in at least some other embodiments, the inlet opening 36 is centered between the front frame 30 and the rear frame 32. Also, in at least some embodiments, the inlet opening 36 extends only a portion of the height of the enclosure 10. As will be explained more fully below, exhaust air from equipment stored in the enclosure 10 is routed into the inlet opening 36 of the duct 12 and is then routed out of the enclosure 10 through the rear opening 34 of the duct 12.

Figure 3C:
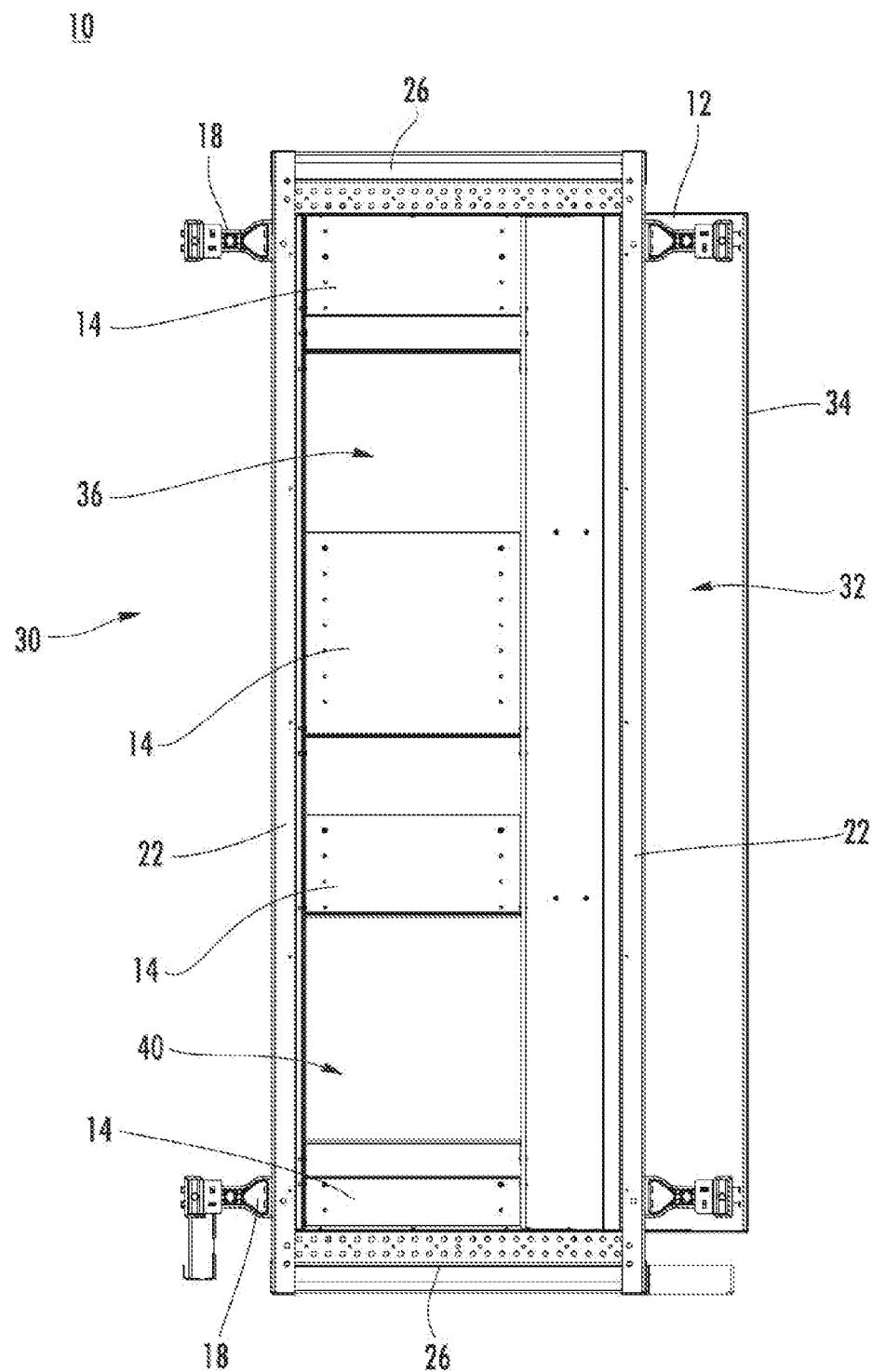
FIG. 3C is a right side plan view of the electronic equipment enclosure of FIG. 3A, shown with the air directing device removed.
Figure 3D:
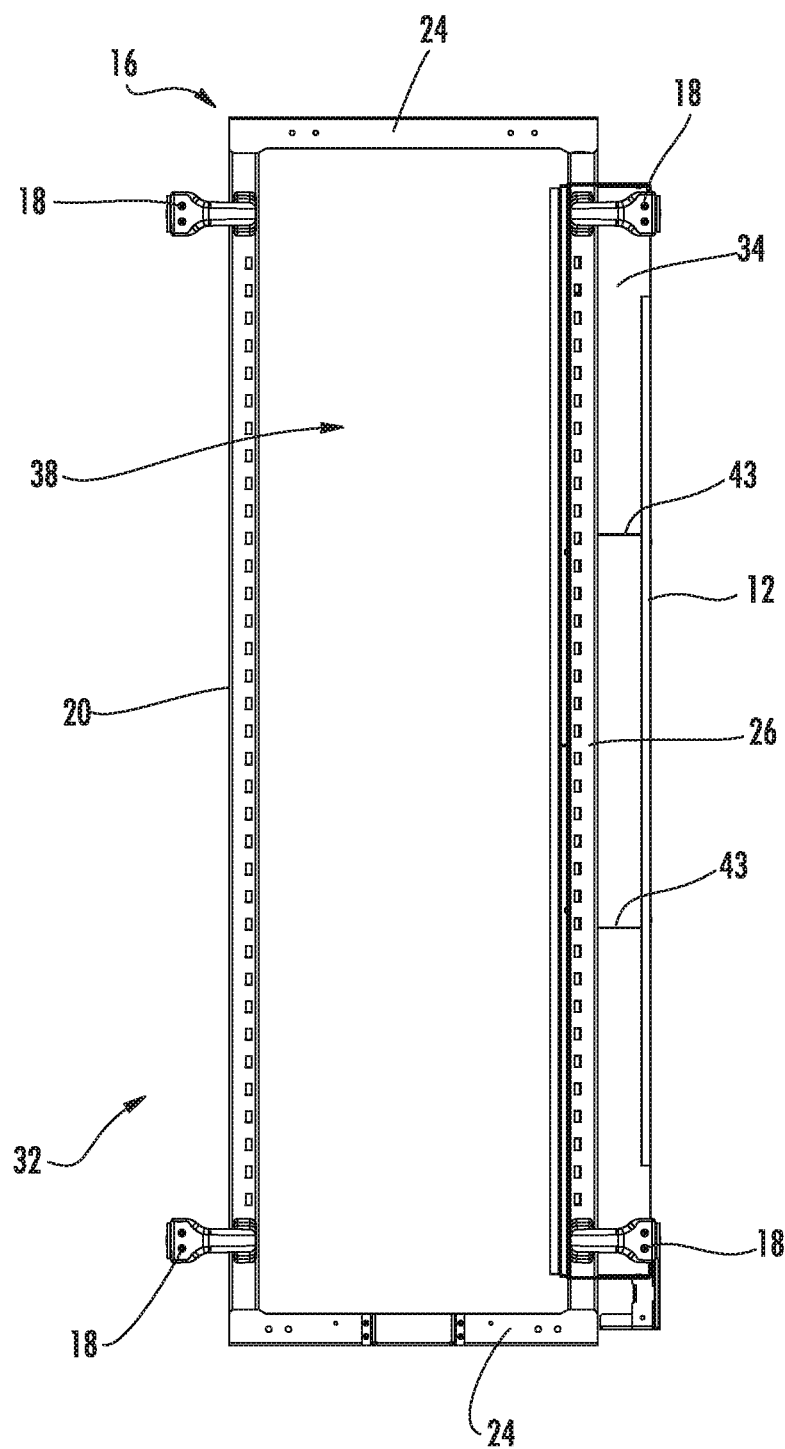
FIG. 3D is a back plan view of the electronic equipment enclosure of FIG. 3A, shown with the air directing device removed.
Figure 3E:
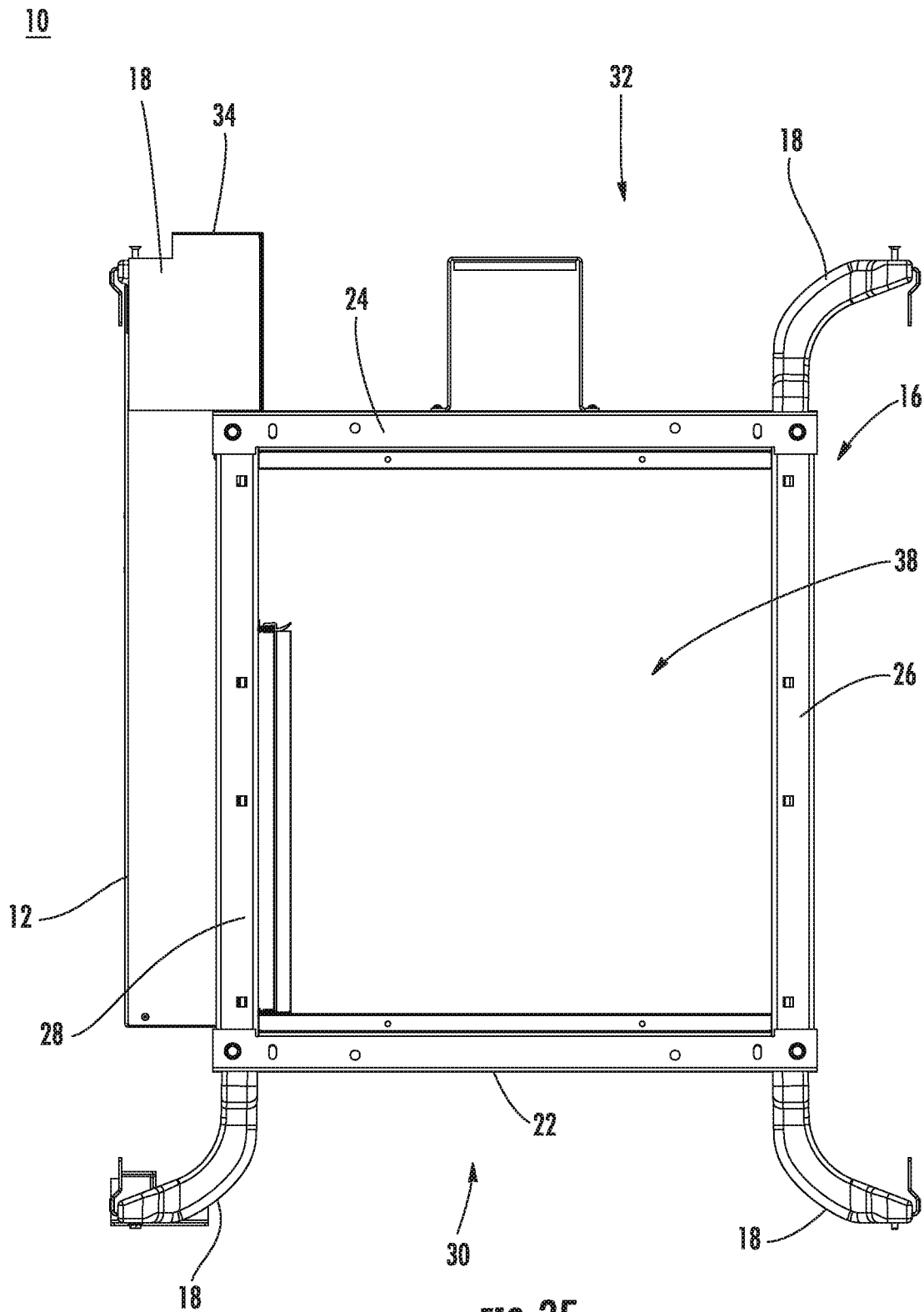
FIG. 3E is a top plan view of the electronic equipment enclosure of FIG. 3A, shown with the air directing device removed.
Figure 3F:
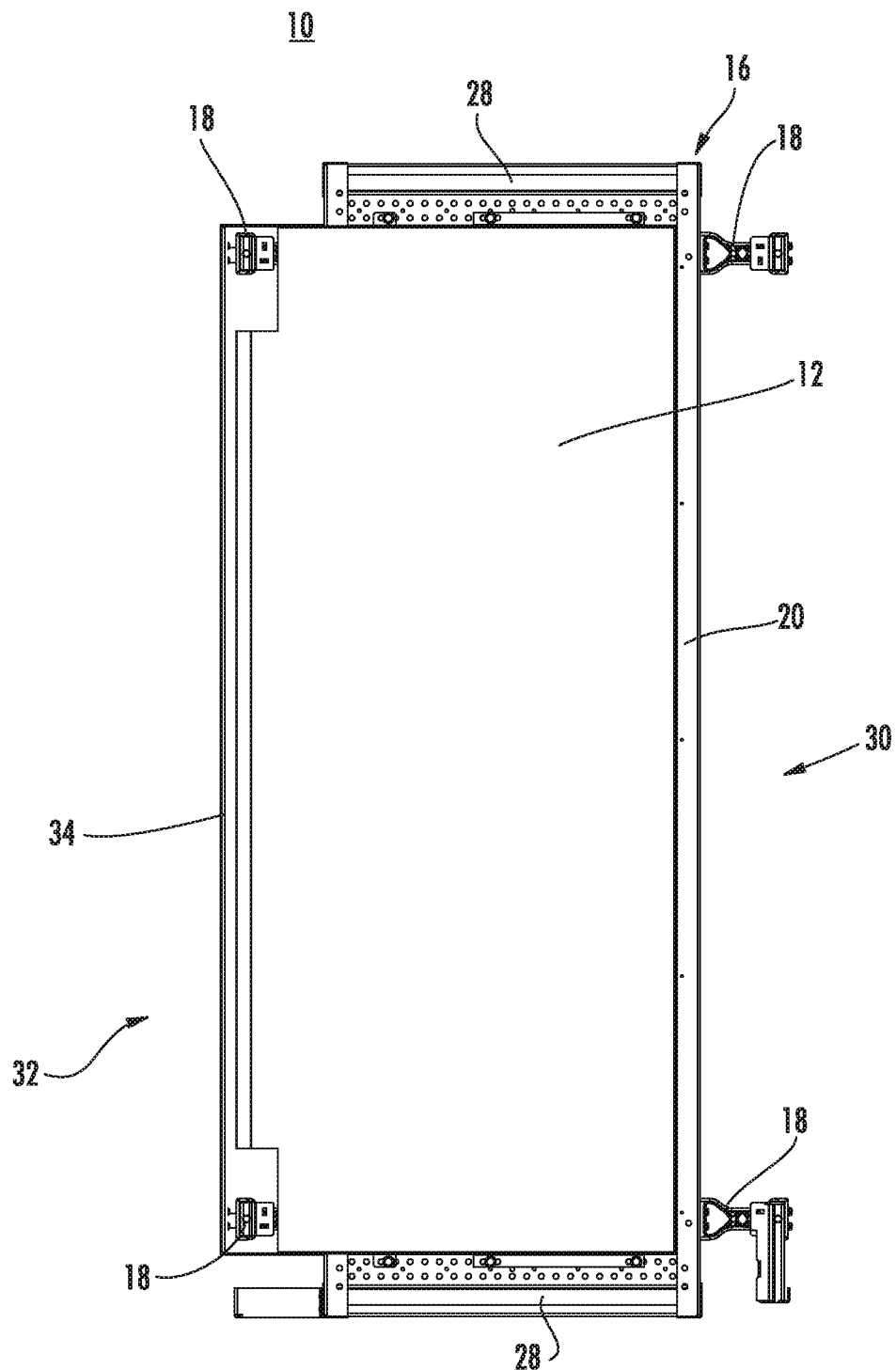
FIG. 3F is a left side plan view of the electronic equipment enclosure of FIG. 3A, shown with the air directing device removed.

As perhaps best shown in FIGS. 3A and 3C, one or more adjustable filler panel assemblies 14 may be disposed as desired in the inlet opening 36 of the internal exhaust duct 12. In the particular arrangement illustrated, four adjustable filler panel assemblies 14 are disposed in the inlet opening 36. It will be appreciated that the four illustrated panel assemblies 14 are merely exemplary of the various combinations of panel assemblies 14 that could be used in the inlet opening 36 of the exhaust duct 12. The filler panel assemblies 14 selectively close off portions of the inlet opening 36 of the internal exhaust duct 12 and create a barrier between the exhaust duct 12 and the interior 38 of the enclosure 10 so that air passing from equipment mounted in the enclosure 10 through exhaust openings 40 into the exhaust duct 12 does not return from the exhaust duct 12 back into the interior 38 of the enclosure 10. For example, in the embodiment shown in FIGS. 3A-3F, an exhaust opening 40 is left between the lowermost filler panel assembly 14 and the next higher filler panel assembly 14. This opening 40 is utilized to release air exhausted by equipment stored in the enclosure 10 into the exhaust duct 12. More particularly, the opening 40 that is formed in the exhaust duct inlet 36 may be aligned with the exhaust grilles of one or more particular pieces of equipment so that air exhausted by the equipment is routed into and through the exhaust duct 12 and out the rear of the enclosure 10. Through proper sizing and alignment of one or more filler panel assemblies 14, further described hereinbelow, the exhaust opening 40 may be sized and aligned appropriately to fit the exhaust grille or grilles of the particular piece or pieces of equipment to avoid air exhausted by the equipment escaping into the interior 38 of the enclosure 10 and adding undesirable heat to the enclosure 10. Furthermore, as further described hereinbelow, it is preferred that the inlet opening 36 of the duct 12 and edges of the filler panel assembly 14 that are in contact with active equipment be fitted with a compliant sealing material such as a rubber seal 57, perhaps best shown in FIGS. 8-11, to minimize air leakage into the interior 38 of the enclosure 10.

As described previously, network switches tend to generate a large amount of heat and therefore are often of particular concern when considering thermal management of an enclosure. However, it will be appreciated by the Ordinary Artisan that the present invention is likewise applicable to a wide variety of other types of equipment.

It will further be appreciated that because of the adjustable nature of the filler panel assemblies 14, the placement and sizing of each exhaust opening 40 is also adjustable. Each opening 40 may be made larger or smaller depending, for example, on the size of the exhaust grille or grilles of the particular piece or pieces of equipment, and it may be created higher or lower in the enclosure 10 depending on the placement of the particular piece or pieces of equipment from which air is being exhausted. Additionally, although not shown, multiple exhaust openings 40 may be created for multiple pieces of equipment. In essence, the adjustable filler panel assembly 14 enables the exhaust duct 12 to be custom fit to the particular piece or pieces of equipment.

Figure 4A:
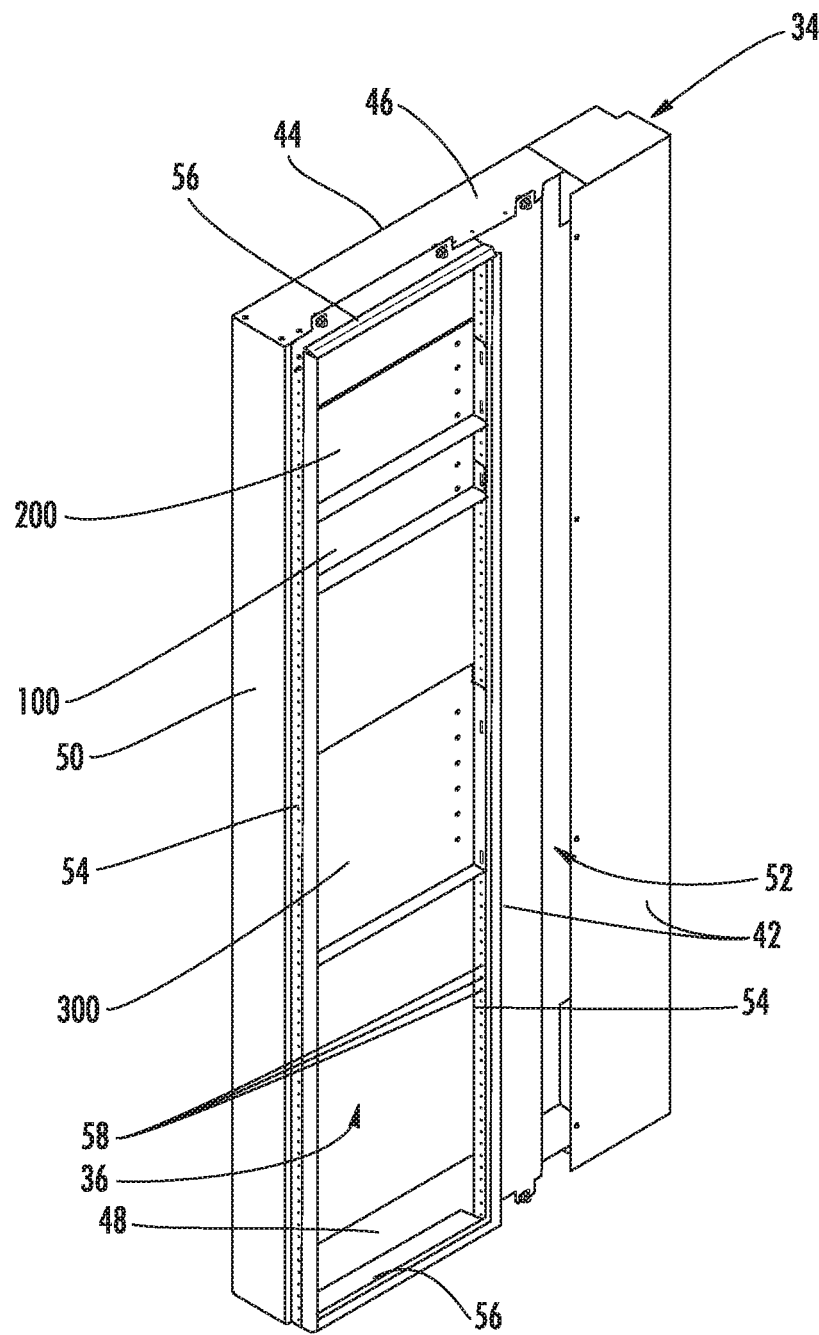
FIG. 4A is a front orthogonal view of the internal exhaust duct of FIG. 3A, shown with the air directing device and the lowermost filler panel assembly removed.
Figure 4B:
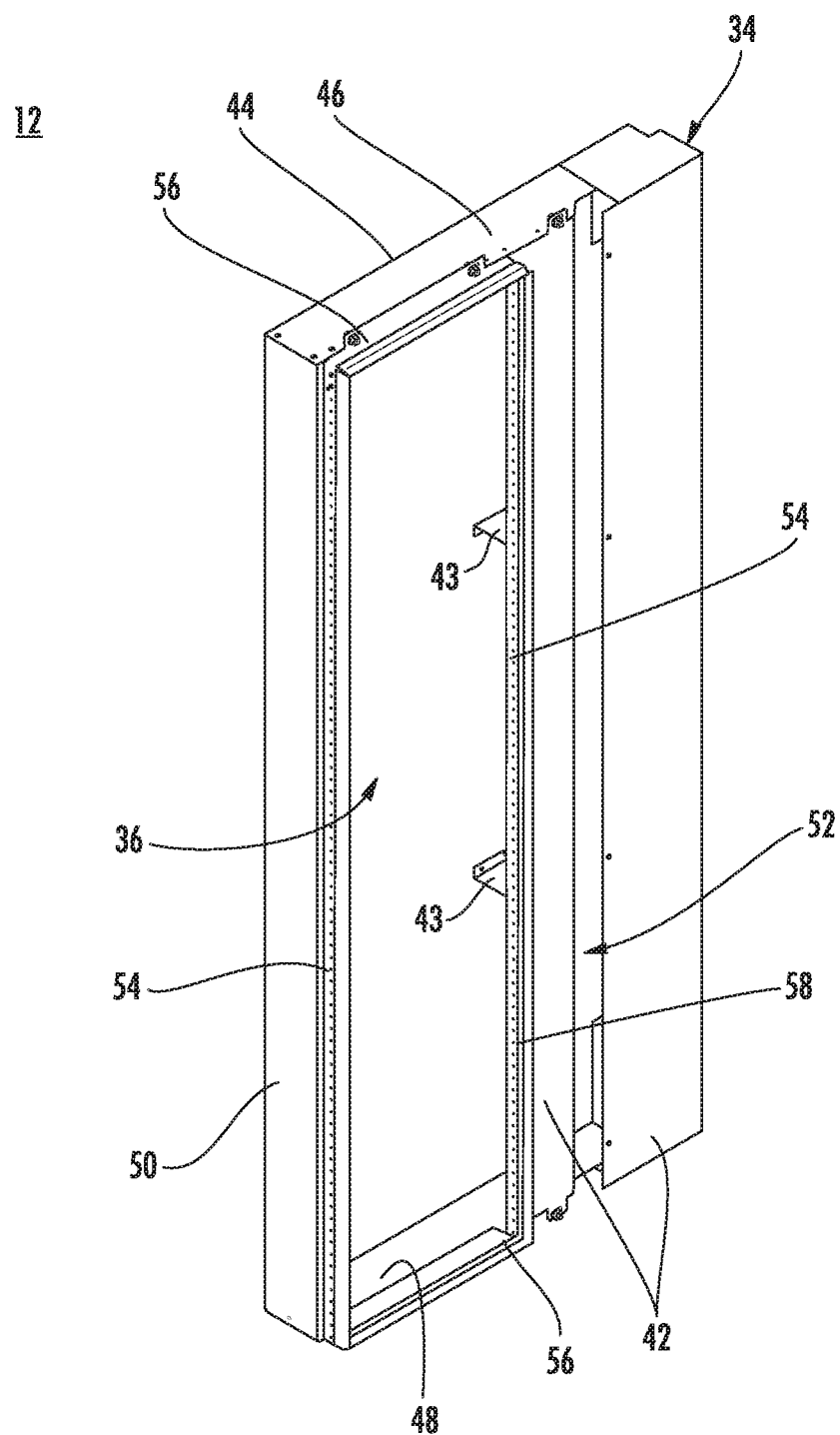
FIG. 4B is a front orthogonal view of the internal exhaust duct of FIG. 4A, shown with all of the adjustable filler panel assemblies removed.
Figure 4C:
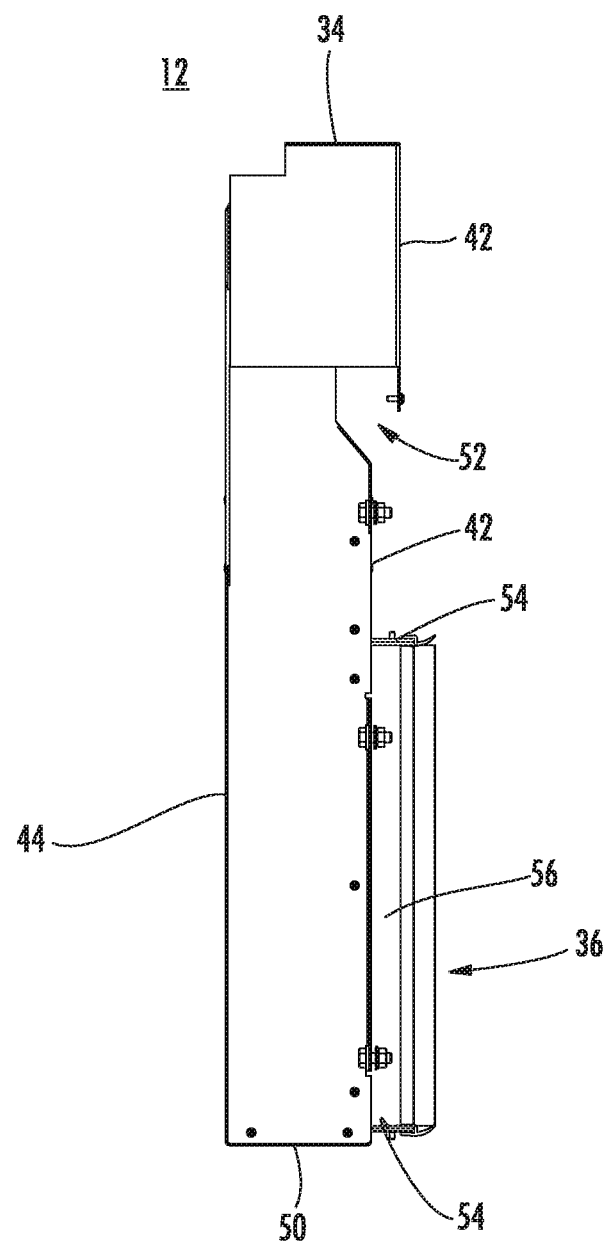
FIG. 4C is a top plan view of the internal exhaust duct of FIG. 4A.
Figure 5:
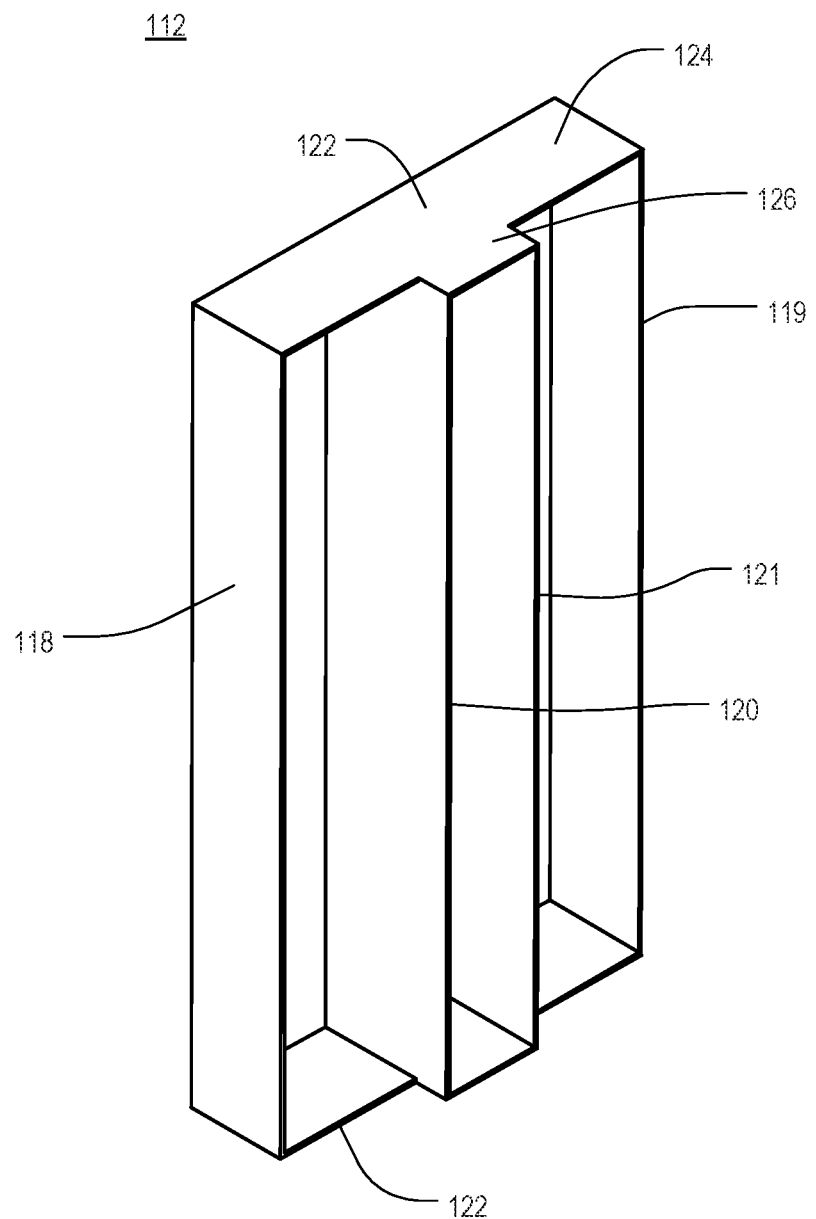
FIG. 5 is an orthogonal view of the air directing device of FIG. 3A.

FIGS. 4A-4C are various views of the internal exhaust duct of FIG. 3A, shown with the air directing device and one or more of the lowermost filler panel assemblies removed. The exhaust duct 12 is somewhat box-like in shape having opposing inner 42 and outer side walls 44, opposing top and bottom walls 46,48, and a front side wall 50. As explained above, the rear portion opening 34 enables exhausted air to flow therethrough to the rear of the enclosure 10. Each of the walls may include one or more panels. The outer side wall 44 is preferably a continuous or solid panel, however, the inner side wall 42 is bifurcated, with a first portion extending from the inlet opening 36 to the rear vertical member 20 and a second portion, inset from the first portion as perhaps best shown in FIG. 4C, extending from the rear vertical member 20 to the rear of the exhaust duct 12. Together, the first and second wall portions define an additional opening 52 for receipt of a vertical member 20 of the frame structure 16 of the enclosure 10. The inner and outer side walls 42,44 may be held in place relative to each other by one or more spacers 43. When the exhaust duct 12 is installed in an enclosure 10, the front wall 50 is oriented toward the front of the enclosure 10, the outer side wall 44 is oriented toward one of the side panels 6 of the expansion kit, and the inner panel 42 is oriented toward the interior 38 of the enclosure 10 so that the inlet opening 36 may be aligned with the exhaust grille or grilles of equipment mounted in the enclosure 10.

The exhaust duct 12 thus forms a substantially enclosed structure with the exception of the rear portion opening 34, the inlet opening 36 and preferably the frame structure opening 52. However, the frame structure opening 52 is enclosed and sealed by the frame structure 16 when the exhaust duct 12 is installed in the enclosure 10, and much of the inlet opening 36 is closed by the plurality of adjustable filler panel assemblies 14. As such, air that flows into the exhaust duct 12 through the exhaust openings 40 formed in the inlet opening 36 is directed out the rear opening 34 of the exhaust duct 12 to the rear of the enclosure 10 where it is exhausted out of the enclosure 10.

The bifurcation of the inner side wall 42 may assist in the installation of the internal air duct 12 within the enclosure 10. In particular, the portion of the inner side wall 42 nearest the rear of the enclosure 10, together with a portion of the top wall 46 and a portion of the bottom wall 48, may be separable from the remainder of the air duct 12 (with the line of separation visible, for example, in FIG. 4C), thereby permitting the two sections of the air duct 12 to be installed separately. This, in turn, may permit a close fit to be obtained around the rear vertical frame member 20 on the side of the enclosure 10 where the air duct 12 is installed, wherein the rear vertical frame member 20 fits neatly into the opening 52 in the inner side wall 42.

Figure 6:
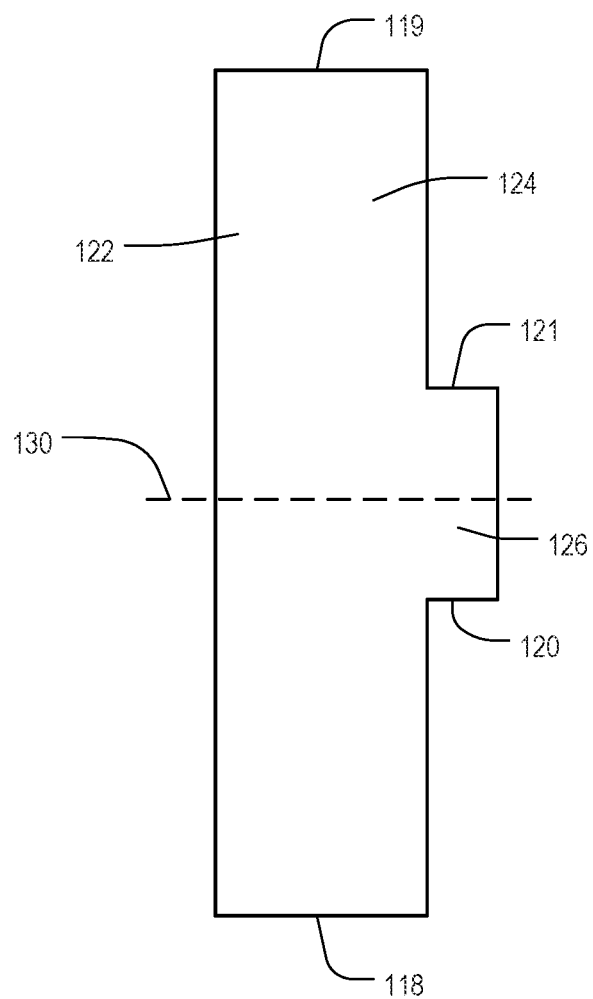
FIG. 6 is a top view of the air directing device of FIG. 5.
Figure 7:
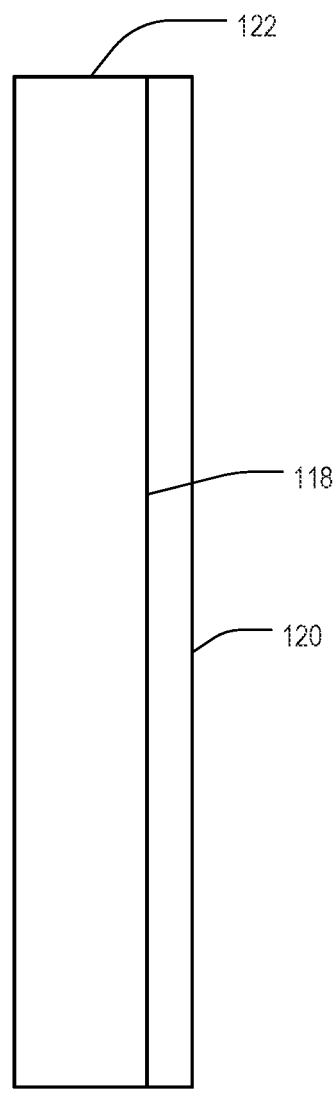
FIG. 7 is a front view of the air directing device of FIG. 5.
Figure 8:
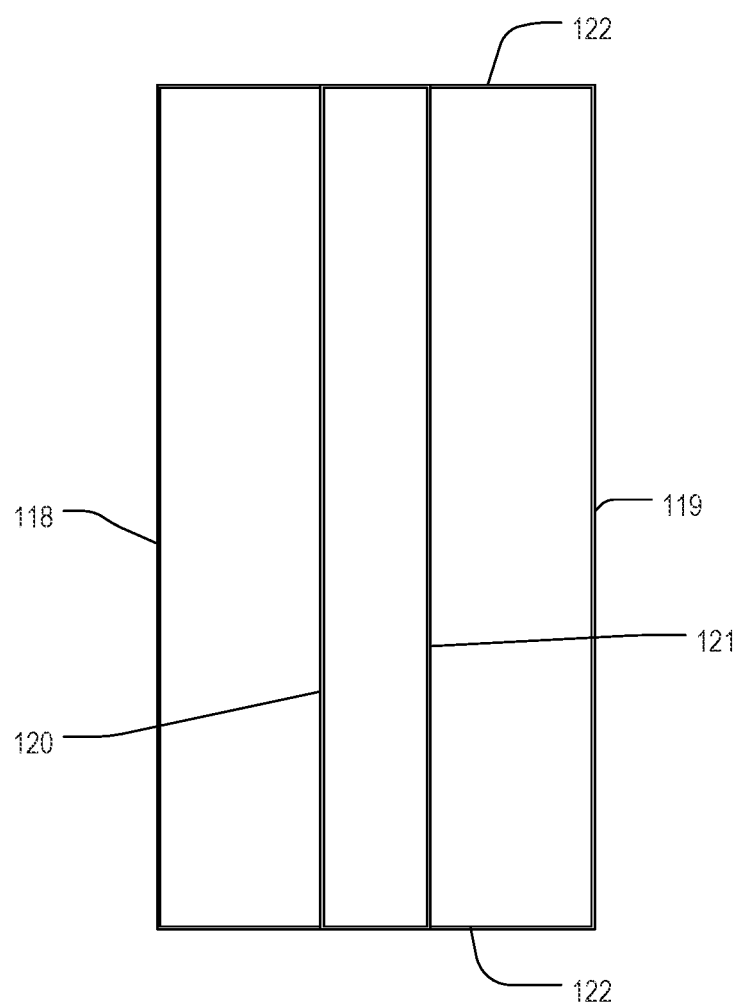
FIG. 8 is a right side view of the air directing device of FIG. 5.

FIGS. 5-8 are various views of the air directing device 112 of FIG. 3A. As shown therein, the air directing device 112 includes four vertical planar structures or panels 118,119, 120,121 disposed in generally parallel relationship with one another and with the front and rear panels of the enclosure 10. Two outer panels 118,119 have similar width and two inner panels 120,121 have similar width with the two outer panels 118,119 being relatively less wide than the two inner panels 120,121. As used herein, the width of the panels 118,119,120,121 and particularly the width of the inner panels 120,121 defines the depth of the air directing device 112. As illustrated in FIG. 6, the two sides of the air directing device 112 are symmetric with respect to one another along imaginary line 130.

The panels 118,119,120,121 are horizontally spaced a fixed distance from one another and are connected via top and bottom connection plates 122. The connection plates 122 are generally T-shaped with the cross arm 124 of the T-shape being relatively longer than the trunk 126 of the T-shape. The length of the cross arm 124 is determined by the distance between the two outer panels 118,119 of the air directing device 112, which in turn may be determined by the dimensions of the electronic equipment with which the air directing device is to be used. The width of the cross arm 124 is determined by the width of the two outer panels 118,119. The length of the trunk 126 of the T-shape is determined by the width of the two inner panels 120,121.

The air directing device 112 is disposed in the side space 114 of the enclosure 10, and more specifically, the air directing device 112 is vertically positioned near the inlet grille (not shown) of an active side breathing piece of equipment 128 so that the air directing device 112 is oriented generally orthogonally to the side breathing equipment 128.

As used herein, the term "side breathing equipment" may be understood to include any equipment that utilizes side-to-side cooling.

The vertical panels 118,119,120,121 form vertical fins that deflect cooling air into side breathing equipment 128 mounted in the enclosure 10. More specifically, in the illustrated embodiment, the inner panels 120,121 are dimensioned such that their outer ends come in near proximity to the enclosure side panel, as shown in FIG. 6, and therefore essentially block air from flowing past. On the other hand, as indicated above, the outer panels 118,119 are of shorter width than the inner panels 120,121 and thus allow a portion of the cooling air to flow between them and the side panel of the enclosure 10. More specifically, the outer panels 118,119 divert a portion of the cooling air to the outer portions of the inlet grille of the equipment 128 and allow a portion of the cooling air to flow past. The portion of air that flows past the outer panels 118,119 is blocked by the inner panels 120,121 so that the remainder of the cooling air is directed to turn orthogonally into the inlet grille of the side breathing equipment 128.

The air directing device 112, and specifically, the widths of the vertical panels 118,119,120,121 should be designed to minimize air restriction within the enclosure 10 while suppressing formation of air vortex zones in the forward and rear sections of the equipment 128. In an enclosure 10, airflow through the side space 114 is restricted somewhat by the need to flow around the enclosure frame members, cable bundles, and other internal accessories. These restrictions cause the air velocity adjacent to the side panel to increase. The momentum effect of the airflow often generates an air vortex in the equipment 128. More particularly, in enclosures that do not have an air directing device 112, the momentum of the cooling air as it makes the orthogonal turn from flowing past the side of the equipment 128 toward the side of the equipment 128, and subsequently entering the equipment 128, typically generates a vortex in the network equipment 128. The air vortex creates the problem of recirculation that unfavorably effects the amount of heat that is removed from the equipment 128. The presence of the air directing device 112 in the side space 114 of enclosure 10 reduces the formation of vortex zones thereby substantially eliminating recirculation within the side breathing equipment 128. Without a recirculation problem, cooling fans of the side breathing equipment 128 are able to provide a maximum cooling effect for the side breathing equipment 128 thereby improving thermal management of the side breathing equipment 128.

The spacing of the vertical panels 118,119,120,121 of the air directing device 112 may vary based on the size and flow characteristics of the side breathing equipment 128 with which the air directing device 112 is associated, the dimensions and placement of the equipment air intake grille or grilles, and the like. In at least some embodiments, the equipment 128 may include a generally continuous air intake grille extending a substantial distance along its side, the outer panels 118,119 are located within the front-to-back envelope of the equipment air intake grille, and the inner panels 120,121 are located symmetrically about a vertically-oriented center plane of the equipment air intake grille. The spacing of the inner panels 120,121 may be adjusted depending on the characteristics of the equipment 128. Taken to the minimum limit, it is contemplated that the two inner panels 120,121 may be reduced to a single inner panel 120,121.

The panels 118,119,120,121 of the air directing device 112 are of sufficient thickness and stiffness to withstand the aerodynamic forces required to redirect inlet air into the side breathing equipment. In addition, the materials selected should have mechanical and electrical properties that are appropriate for a typical computer datacenter environment.

The air directing device 112 can be designed to mount to the side breathing equipment 128, the side panel, the enclosure frame structure or substructure, or any desired combination thereof. In at least some embodiments, the air directing device 112 is supported by horizontal members connected to the vertical mounting rails. Further, construction methods for the air directing device 112 may include injection molded plastic, welded plastic, riveted plastic, riveted metal, welded metal, cast metal, or a combination of plastic and metal joined by rivets, adhesive, and the like. In addition, the panels 118,119,120,121 may be manufactured from a number of materials including sheet metal or plastic.

Figure 9:
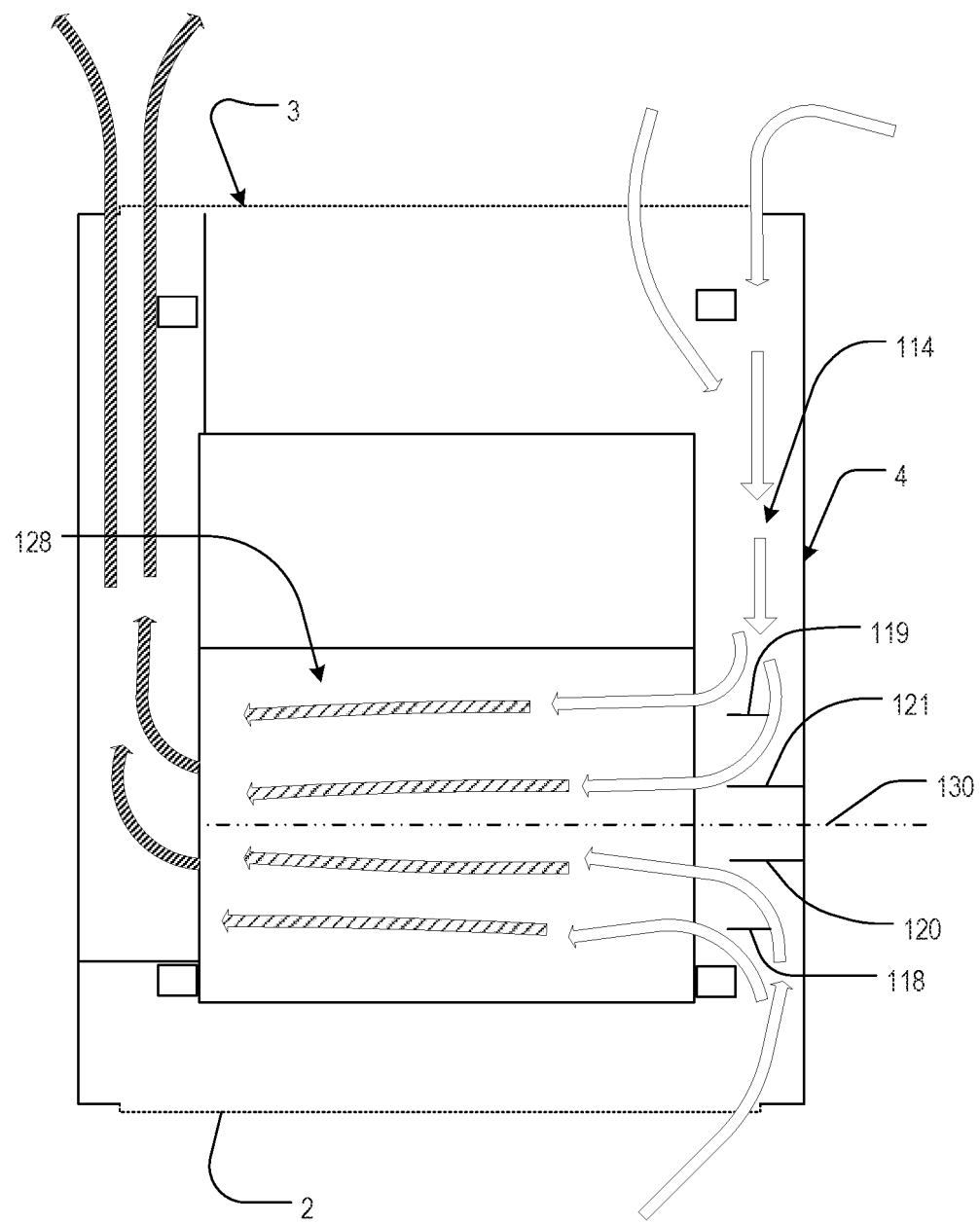
FIG. 9 is a schematic diagram illustrating a top view of an enclosure, with an air directing device and side breathing equipment installed therein, showing a temperature diagram of the air flowing through the enclosure.

As shown in FIG. 9, in operation, inlet airflow enters the side space 114 where the air directing device 112 is located via perforated front and rear doors or panels or other entry means that are known in the art. Fans located inside the electronic equipment 128 may be used to draw cooling air through the enclosure 10 and through the equipment 128. Fans located outside the electronic equipment 128 but inside the enclosure 10, or located entirely outside the enclosure 10 may likewise be used to pull or push cooling air through.

As described previously, the forward outer panel 118 of the air directing device 112 is positioned orthogonally to inlet airflow entering the side space 114 of the enclosure 10 such that a portion of the airflow is diverted near the forward edge of side breathing equipment 128 installed in the enclosure 10. A forward inner panel 120 transects the side space 114 of the enclosure 10 and is used to direct the remaining air stream into the air intake grille of the equipment 128. The set of rear panels 119,121 that mirror the forward panels 118,120 is positioned symmetrically about a vertical center plane of the equipment intake grille. The rear set of panels 119,121 suppress the rear vortex region thereby improving heat removal in the rear of the enclosure 10.

Figure 10:
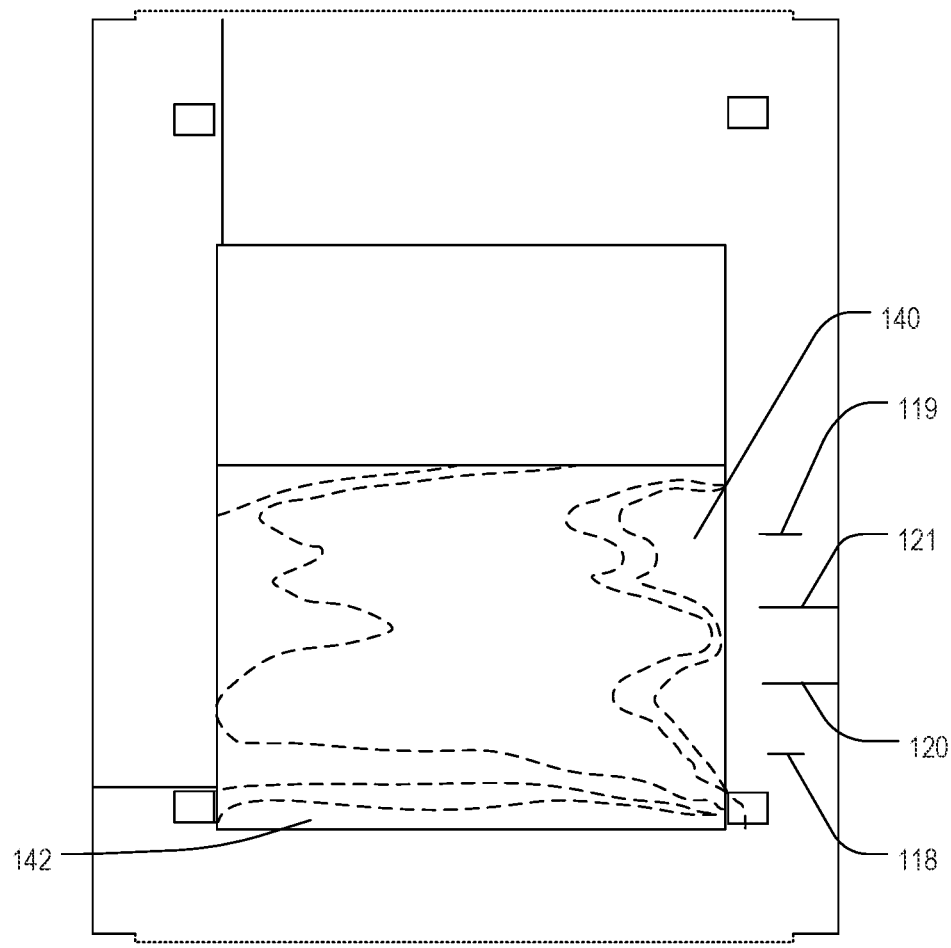
FIG. 10 is a computer simulation of the temperature inside an enclosure, having an air directing device mounted therein in accordance with a preferred embodiment of the present invention, as seen from inside the enclosure looking downward.

FIG. 10 is a computer simulation of the temperature inside an enclosure, having an air directing device 112 mounted therein in accordance with a preferred embodiment of the present invention, as seen from inside the enclosure looking downward. As can be seen, the air directing device 112 significantly reduces recirculation inside side breathing electronic equipment 128, thereby minimizing hot zones within the side breathing equipment 128. More particularly, the temperature in the front area 142 of the equipment 128 is higher than the temperature in the area 140 near the intake, but only slightly so, and the temperature near the rear of the equipment 128 is not almost the same as in the area 140 near the intake.

The reduction leads to an optimal cooling efficiency for the equipment and enclosure system. The addition of an air directing device 112 enables side breathing equipment 128 in an enclosure 10 to operate with more temperature uniformity, i.e., more uniformly cool, than is possible in free air outside of an enclosure 10. By optimally positioning the air directing device 112, recirculation zones or vortices within the equipment 128 are diminished and passive cooling efficiency is maximized.

Although not illustrated herein, it will be understood that in at least some embodiments, an air directing device may be provided that includes only two panels, wherein one of the panels has a width similar to that of the outer panels 118 and the other panel has a width similar to that of the inner panels 120. The function of such an air directing device is similar to that of the air directing device 112 described previously, except that it may be suitable for controlling airflow from only one direction, i.e., from the front only or the rear only, but not both. Such a device may be appropriate if airflow is in fact only being provided from one direction to side breathing equipment 128.

The vertical dimensions of any of the air directing devices described herein may be selected to match the amount of equipment, and particularly side breathing equipment 128, that is to be mounted in a given enclosure 10. To accomplish this, it is contemplated that in at least one commercial embodiment, air directing devices having a variety of different lengths, at least some of which are designed to extend substantially the entire height of enclosures 10 of known dimensions, are provided. When an installer or other user chooses to place side breathing equipment 128 in an enclosure 10, he may select an air directing device of a length corresponding to the amount and vertical placement of such equipment 128 in the enclosure 10.

Figure 11:
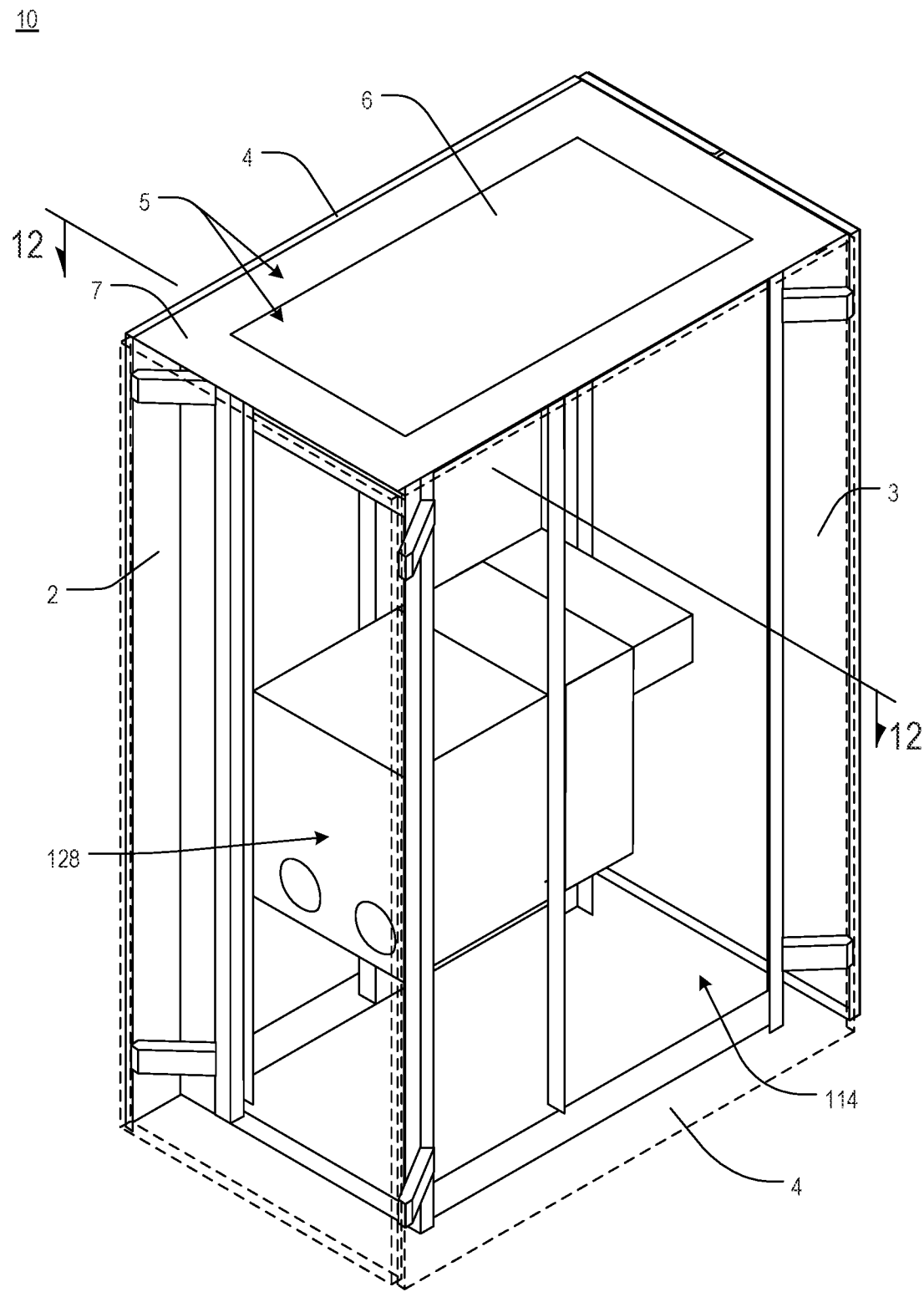
FIG. 11 is an isometric schematic view, shown with a side breathing equipment, utilizing side-to-side cooling, installed therein.

FIG. 11 is an isometric schematic view, shown with a side breathing equipment 128, utilizing side-to-side cooling, installed therein. In the arrangement depicted therein, it is assumed that the side breathing equipment 128 is of a type that receives cooling air through one or more intakes located on the right side and exhausts it via one or more outlets on the left side. It will be appreciated that the various elements of an airflow control system, the rear and side 3,4 and the exterior surfaces of the side breathing equipment 128 itself may create various plenums, including a right-front plenum and a right-rear plenum. It will be further appreciated that the right-front plenum is in fluid communication with a front portion of the intakes on the right side of the side breathing equipment 128, and that the right-rear plenum is in fluid communication with a rear portion of the intakes on the right side of the side breathing equipment 128. Still further, it will be appreciated that the outlet or outlets of the side breathing equipment 128, on the left side, are in fluid communication with the interior of the internal air duct 12.

Figure 12:
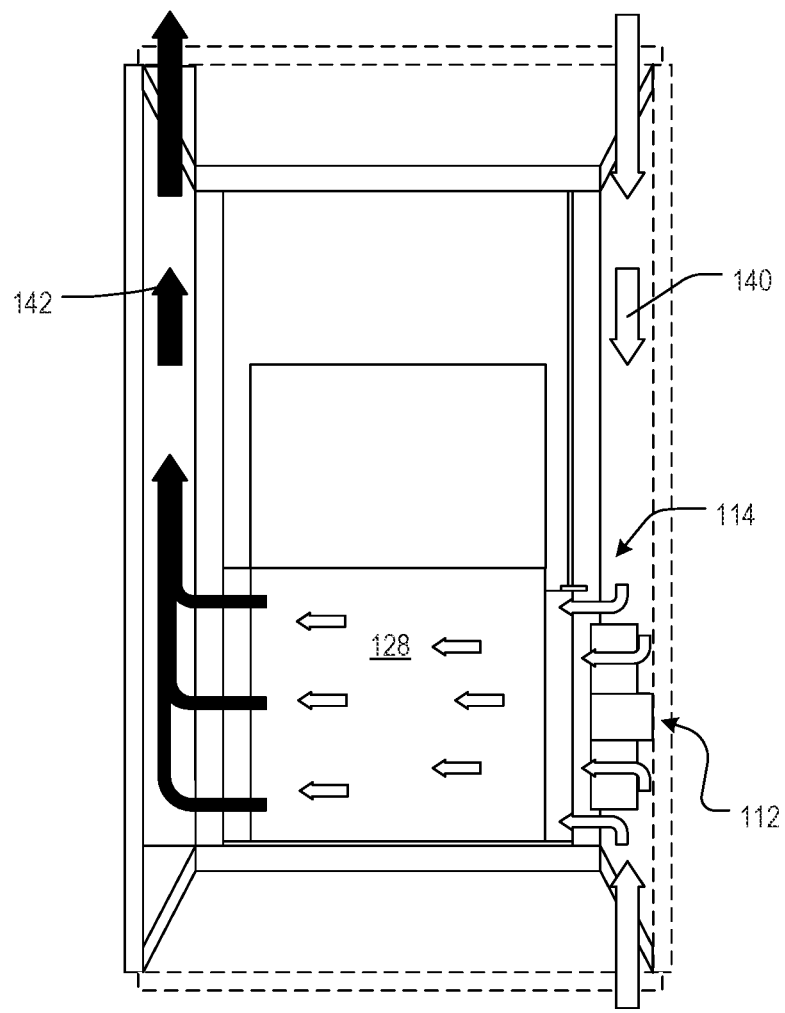
FIG. 12 is a top cross-sectional schematic view of the enclosure system of FIG. 11, taken along line 11-11.

FIG. 12 is a top cross-sectional schematic view of the enclosure system 10 of FIG. 11, taken along line 11-11. As shown therein, cooling air (represented in FIG. 12 by large white arrows) is first routed through the front and rear of the enclosure and into the right plenum. This may be accomplished via vents, perforations or other openings in the front panel 2, by opening a front door (where the front panel 2 includes one or more doors) or by removing the front panel 2. The cooling air is then routed through the various channels in the air directing device 112 and into the intake or intakes of the side breathing equipment 128. Exiting the side breathing equipment 128, the heated exhaust air (represented in FIG. 12 by large black arrows) is routed through the opening of the internal air duct 12, through the internal air duct 12, and out through the rear of the enclosure.

Figure 13:
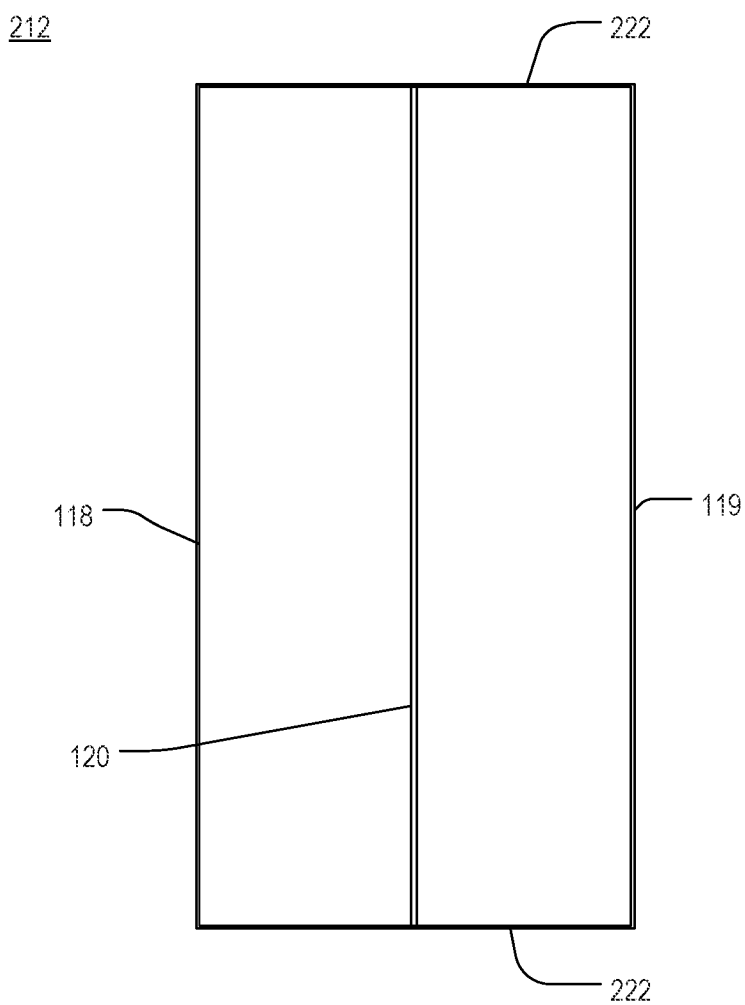
FIG. 13 is a right side view of an embodiment of an air directing device in accordance with one or more aspects of the present invention.
Figure 14:
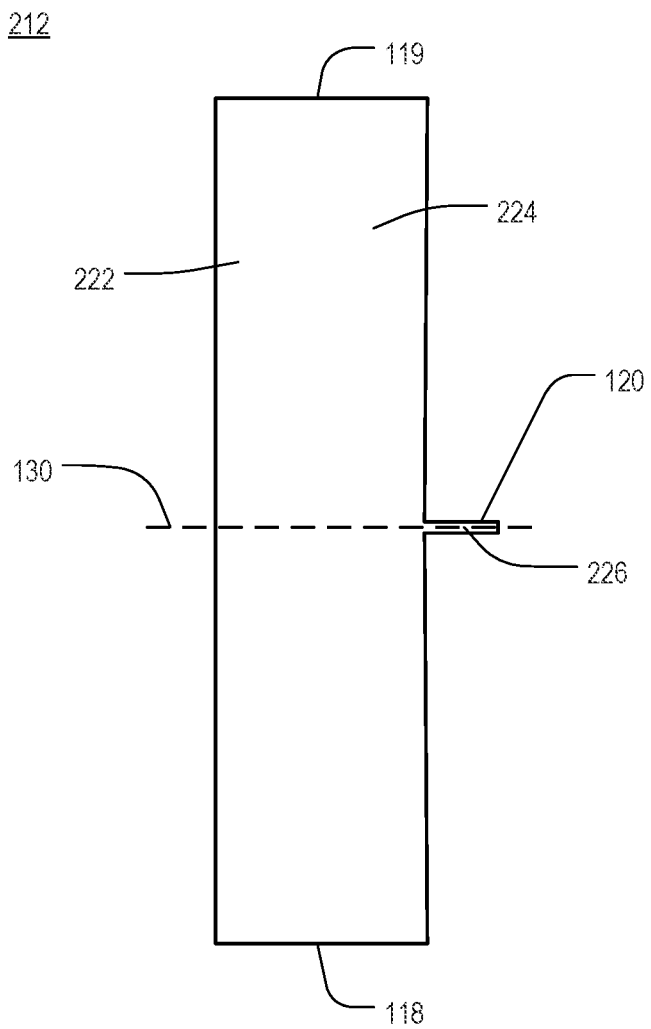
FIG. 14 is a top view of the air directing device of FIG. 13.

FIGS. 13-14 are various views of another air directing device 212 in accordance with one or more aspects of the present invention. As shown therein, the air directing device 212 includes three vertical planar structures or panels 118, 119,120 disposed in generally parallel relationship with one another and with the front and rear panels of the enclosure 10. Two outer panels 118,119 have similar width and one inner panel 120 has a greater width than the two outer panels 118,119. As used herein, the width of the panels 118,119,120 and particularly the width of the inner panel 120 defines the depth of the air directing device 212. As illustrated in FIG. 14, the two sides of the air directing device 112 are symmetric with respect to one another along imaginary line 130.

The panels 118,119,120 are horizontally spaced a fixed distance from one another and are connected via top and bottom connection plates 222. The connection plates 222 may optionally be generally T-shaped with the cross arm 224 of the T-shape being relatively longer than the trunk 226 of the T-shape. The length of the cross arm 124 is determined by the distance between the two outer panels 118,119 of the air directing device 212, which in turn may be determined by the dimensions of the electronic equipment with which the air directing device is to be used. The width of the cross arm 224 is determined by the width of the two outer panels 118,119. The connection plates 222 may or may not have a trunk 226. To the extent that a trunk 226 is present in the connection plates 222, the length of the trunk 226 of the T-shape is determined by the width of the inner panel 120.

The air directing device 212 is disposed in the side space 114 of the enclosure 10, and more specifically, the air directing device 112 is vertically positioned near the inlet grille (not shown) of an active side breathing piece of equipment 128 so that the air directing device 212 is oriented generally orthogonally to the side breathing equipment 128. As used herein, the term "side breathing equipment" may be understood to include any equipment that utilizes side-to-side cooling.

The vertical panels 118,119,120 form vertical fins that deflect cooling air into side breathing equipment 128 mounted in the enclosure 10. More specifically, in the illustrated embodiment of FIGS. 13-14, the inner panel 120 is dimensioned such that the outer end comes in near proximity to the enclosure side panel, and therefore essentially blocks air from flowing past. On the other hand, as indicated above, the outer panels 118,119 are of shorter width than the inner panel 120 and thus allow a portion of the cooling air to flow between them and the side panel of the enclosure 10. More specifically, the outer panels 118,119 divert a portion of the cooling air to the outer portions of the inlet grille of the equipment 128 and allow a portion of the cooling air to flow past. The portion of air that flows past the outer panels 118,119 is blocked by the inner panel 120 so that the remainder of the cooling air is directed to turn orthogonally into the inlet grille of the side breathing equipment 128.

In at least one still further embodiment not illustrated herein, an air directing device includes vertical panels of at least different widths, whereby at least one outer panel directs a first portion of the airflow in a side space of an electronic equipment enclosure toward side breathing equipment mounted in the enclosure but allows a second portion of airflow to pass thereby, at least one intermediate panel directs a third portion of the airflow toward the side breathing equipment but allows a fourth portion of the airflow to pass thereby, and at least one inner panel directs some or all of the fourth portion of the airflow toward the side breathing equipment.

In a still further feature of the present invention, any of the embodiments described or illustrated herein may be modified by angling all or a portion of some or all of the vertical panels toward the equipment, by curving all or a portion of some or all of the vertical panels toward the equipment, or both, thereby providing a smoother transition for the orthogonal turn applied to the airflow. Such a feature may promote greater laminar flow and less turbulence, thereby increasing the efficiency of the cooling process.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A method of cooling side breathing electronic equipment in an electronic equipment enclosure formed from front, rear, and side panels mounted on a frame, comprising:
   routing a supply of cool air into a first plenum of the electronic equipment enclosure along an intake side of the side breathing electronic equipment, the supply of cool air following a generally horizontal airflow path;
   routing a first portion of the supply of cool air against a first vertically-oriented baffle arranged orthogonally relative to the generally horizontal airflow path, thereby diverting the first portion of the supply of cool air into one or more air intake openings at the intake side of the side breathing electronic equipment;
   routing a second portion of the supply of cool air past the first vertically-oriented baffle and against a second vertically-oriented baffle, which is generally parallel and non-coplanar with the first vertically-oriented baffle and includes a width that is greater than a width of the first vertically-oriented baffle, thereby diverting the second portion of the supply of cool air into the one or more air intake openings at the intake side of the side breathing electronic equipment; and
   routing the first and second portions of the supply of cool air through the side breathing electronic equipment, thereby cooling the side breathing electronic equipment, and through one or more air outlet openings at an outlet side of the side breathing electronic equipment into a second plenum of the electronic equipment enclosure along the outlet side of the side breathing electronic equipment as heated exhaust air.

2. The method of claim 1, wherein the second portion of the supply of cool air includes substantially an entirety of a remainder of the supply of cool air not included in the first portion.

3. The method of claim 1, further comprising routing the heated exhaust air from the second plenum through an exit opening located at a rear of the electronic equipment enclosure.

4. The method of claim 1, wherein the first vertically-oriented baffle is located between the front panel and the second vertically-oriented baffle, and wherein the airflow path in the first plenum is front-to-back.

5. The method of claim 1, wherein the first vertically-oriented baffle is located between the rear panel and the second vertically-oriented baffle, and wherein the airflow path in the first plenum is back-to-front.

6. The method of claim 1, wherein the second vertically-oriented baffle abuts one of the side panels.

7. The method of claim 6, wherein a gap exists between the first vertically-oriented baffle and the one of the side panels such that the second portion of the supply of cool air passes through the gap.

8. The method of claim 1, wherein one or more of the routing steps involve actively routing air.

9. The method of claim 1, wherein one or more of the routing steps involve passively routing air.

10. The method of claim 1, wherein the first portion of the supply of cool air is diverted into at least a forward one of the one or more air intake openings at the intake side of the side breathing electronic equipment and the second portion of the supply of cool air is diverted into at least one of the one or more air intake openings that is rearward of the forward one of the one or more air intake openings.

11. The method of claim 1, wherein the side breathing electronic equipment includes a front side and a rear side, and wherein the first vertically-oriented baffle is disposed adjacent the side breathing electronic equipment, forward of the rear side of the side breathing electronic equipment and rearward of the front side of the side breathing electronic equipment.

12. The method of claim 11, wherein the second vertically-oriented baffle is disposed adjacent the side breathing electronic equipment, forward of the rear side of the side breathing electronic equipment and rearward of the front side of the side breathing electronic equipment.

13. A method of cooling side breathing electronic equipment in an electronic equipment enclosure formed from front, rear, and side panels mounted on a frame, comprising:
routing a supply of cool air along an airflow path into a first plenum of the electronic equipment enclosure at an intake side of the side breathing electronic equipment;
routing a first portion of the supply of cool air against a first baffle arranged transversely relative to the airflow path, thereby diverting the first portion of the supply of cool air into one or more air intake openings at the intake side of the side breathing electronic equipment;
routing a second portion of the supply of cool air past the first baffle and against a second baffle, which,
is generally parallel and non-coplanar with the first baffle,
includes a width that is greater than a width of the first baffle, and
abuts one of the side panels,
thereby diverting the second portion of the supply of cool air into the one or more air intake openings at the intake side of the side breathing electronic equipment; and
routing the first and second portions of the supply of cool air through the side breathing electronic equipment, thereby cooling the side breathing electronic equipment, and through one or more air outlet openings at an outlet side of the side breathing electronic equipment into a second plenum of the electronic equipment enclosure along the outlet side of the side breathing electronic equipment as heated exhaust air.

14. The method of claim 13, wherein the second portion of the supply of cool air includes substantially an entirety of a remainder of the supply of cool air not included in the first portion.

15. The method of claim 13, further comprising routing the heated exhaust air from the second plenum through an exit opening located at a rear of the electronic equipment enclosure.

16. The method of claim 13, wherein the first baffle is located between the front panel and the second baffle, and wherein the airflow path in the first plenum is front-to-back.

17. The method of claim 13, wherein the first baffle is located between the rear panel and the second baffle, and wherein the airflow path in the first plenum is back-to-front.

18. The method of claim 13, wherein a gap exists between the first baffle and the one of the side panels such that the second portion of the supply of cool air passes through the gap.

19. The method of claim 13, wherein one or more of the routing steps involve actively routing air.

20. The method of claim 13, wherein one or more of the routing steps involve passively routing air.

* * * * *